United States Patent
Ebara

(10) Patent No.: US 8,871,894 B2
(45) Date of Patent: Oct. 28, 2014

(54) PRODUCTION METHOD OF POLYHYDROXYIMIDE

(75) Inventor: Kazuya Ebara, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 103 days.

(21) Appl. No.: 13/264,917

(22) PCT Filed: Apr. 22, 2010

(86) PCT No.: PCT/JP2010/057151
§ 371 (c)(1),
(2), (4) Date: Dec. 7, 2011

(87) PCT Pub. No.: WO2010/123066
PCT Pub. Date: Oct. 28, 2010

(65) Prior Publication Data
US 2012/0094232 A1    Apr. 19, 2012

(30) Foreign Application Priority Data

Apr. 23, 2009  (JP) .................................. 2009-105399
Sep. 17, 2009  (JP) .................................. 2009-215681

(51) Int. Cl.
  C08G 69/10   (2006.01)
  G03F 7/023   (2006.01)
  C08G 73/10   (2006.01)
  C09D 179/08  (2006.01)
  G03F 7/004   (2006.01)

(52) U.S. Cl.
  CPC .......... C09D 179/08 (2013.01); G08G 73/1064 (2013.01); G03F 7/0233 (2013.01); C08G 73/1032 (2013.01); G03F 7/0045 (2013.01); C08G 73/1039 (2013.01); C08G 73/1028 (2013.01); C08G 73/1046 (2013.01); C08G 73/1042 (2013.01); C08G 73/106 (2013.01); C08G 73/1075 (2013.01)
  USPC ........ 528/353; 430/270.1; 528/170; 528/310; 528/322

(58) Field of Classification Search
  CPC .............. C08G 73/10; C08G 73/1067; C08G 73/1042; C08G 73/18; C08G 73/1075; C08G 73/1082; C08G 73/1007; C08L 79/08; C08L 79/04; C08F 222/36; C08J 2379/08
  USPC ................. 430/270.1; 528/170, 310, 322, 353
  See application file for complete search history.

(56) References Cited

U.S. PATENT DOCUMENTS

| | | | |
|---|---|---|---|
| 7,026,080 B2 | 4/2006 | Nakayama et al. | |
| 8,080,319 B2 | 12/2011 | Tanaka et al. | |
| 2003/0040578 A1* | 2/2003 | Sugo et al. | .................... 525/100 |
| 2004/0197699 A1 | 10/2004 | Nakayama et al. | |
| 2005/0272907 A1 | 12/2005 | Jin et al. | |
| 2009/0286087 A1 | 11/2009 | Tanaka et al. | |
| 2011/0123927 A1* | 5/2011 | Park et al. | .................. 430/270.1 |

FOREIGN PATENT DOCUMENTS

| | | |
|---|---|---|
| CN | 1556939 A | 12/2004 |
| CN | 1639262 A | 7/2005 |
| JP | A-2-151629 | 6/1990 |
| JP | A-2001-072768 | 3/2001 |
| JP | A-2001-72768 | 3/2001 |

(Continued)

OTHER PUBLICATIONS

International Search Report issued in International Patent Application No. PCT/JP2010/057151 dated Jul. 13, 2010.

(Continued)

*Primary Examiner* — Gregory Listvoyb
(74) *Attorney, Agent, or Firm* — Oliff PLC

(57) ABSTRACT

There is provided a simple production method of a polyhydroxyimide. A production method of a polyhydroxyimide, characterized by comprising adding to a polyhydroxyimide precursor containing a repeating structure of Formula (1):

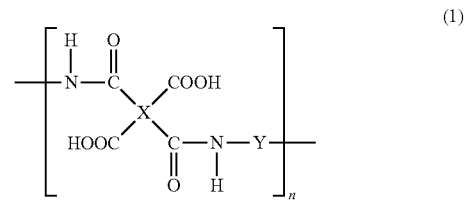

in which X is a tetravalent aliphatic group or aromatic group, Y is an organic group containing an aromatic group substituted with at least one OH group, and n is an integer of 1 or more, at least a compound of Formula (2) or Formula (3):

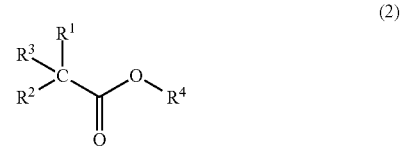

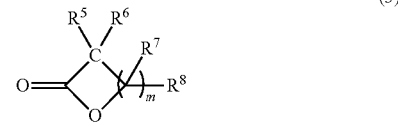

in which $R^1$ to $R^4$ or $R^5$ to $R^8$ are independently a hydrogen atom or a monovalent organic group, and m is a natural number, and heating the resultant reaction mixture at a temperature of 50° C. or more to obtain a polyimide having a weight average molecular weight measured by gel permeation chromatography (GPC) in terms of polystyrene of 5,000 to 100,000.

26 Claims, No Drawings

(56) References Cited

FOREIGN PATENT DOCUMENTS

| | | |
|---|---|---|
| JP | A-2002-012664 | 1/2002 |
| JP | A-2002-212287 | 7/2002 |
| JP | A-2004-126547 | 4/2004 |
| JP | A-2005-173027 | 6/2005 |
| JP | A-2008-285660 | 11/2008 |
| JP | A-2009-024033 | 2/2009 |
| JP | A-2009-126938 | 6/2009 |
| JP | A-2010-085673 | 4/2010 |
| WO | WO 2007/046405 A1 | 4/2007 |
| WO | WO 2009142435 | * 11/2009 |

OTHER PUBLICATIONS

Office Action issued in Chinese Patent Application No. 201080027592.6 dated Nov. 30, 2012 (with translation).

Office Action dated Jun. 19, 2014 issued in Taiwanese Patent Application No. 099112977 (with English translation).

* cited by examiner

PRODUCTION METHOD OF POLYHYDROXYIMIDE

TECHNICAL FIELD

The present invention relates to a production method of a polyhydroxyimide and a hydroxyimide, particularly a production method of a polyhydroxyimide for improving problems in a thermal imidation method or a chemical imidation method that are conventional production methods of a polyimide.

BACKGROUND ART

Polyimide-based resins are excellent in heat resistance, electric insulation, solvent resistance, and mechanical stability, so that they have been conventionally used in various fields.

Particularly, in the electric and electronic material field, a cured film produced from a photosensitive polyhydroxyimide-based resin in which photosensitive properties are imparted by introducing a hydroxy group into a polyimide is found to have not only the above properties of a polyimide-based resin, but also a high resolution or a high sensitivity, so that the application of the cured film is enlarged and the cured film starts to spread into not only the semiconductor field, but also the display field.

For example, there is described a positive photosensitive resin composition using a polyhydroxyimide as a material capable of obtaining a positive pattern having a high resolution, a high sensitivity, and an advantageous size controlling property.

It is considered that the polyhydroxyimide can be produced, for example, by the same method as a production method of a polyimide. That is, there is first conceived a method for obtaining an imide by reacting a tetracarboxylic dianhydride and a diamine as monomers to synthesize a polyamic acid that is an imide precursor and then by cyclizing the polyamic acid either by (a) heating the polyamic acid to dehydrate the polyamic acid (thermal imidation method) or by (b) using a dehydrocondensing agent or a ring closing catalyst (chemical imidation method).

In the production of a polyimide by (a) the thermal imidation method, there is adopted a method in which a heating-dehydration reaction is effected by using an acid catalyst or an azeotropic solvent as an assistant for an imidation reaction to imidate the polyamic acid. At this time, generally, the polyamic acid is heated to a temperature of 180° C. to 250° C. to effect the reaction.

In the production of a polyimide by (b) the chemical imidation method, there is adopted a method in which a dehydrocondensing agent and a ring closing catalyst are directly added to a polyamic acid solution and the resultant mixture is heated and dried. As the dehydrocondensing agent, a carboxylic anhydride such as acetic anhydride, propionic anhydride, and benzoic anhydride or DCC (dicyclohexylcarbodiimide) is utilized. As the ring closing catalyst, an aliphatic tertiary amine such as triethylamine, heterocyclic tertiary amine such as isoquinoline, pyridine, β-picoline, aminopyridine, and imidazole, or the like is utilized, particularly, an acetic anhydride-pyridine-based ring closing catalyst is widely used (for example, Patent Document 1).

However, when (b) the chemical imidation method is applied to the production of a polyhydroxyimide, even a hydroxy group in a side chain of a polyamic acid is reacted with a large amount of acetic anhydride existing in the reaction system to be converted into an acetoxy group, so that when (b) the chemical imidation method is applied to a photosensitive resin composition or the like, there is the problem that a necessary developing group (hydroxy group) becomes inactivated.

Therefore, as the method for producing a polyhydroxyimide without inactivating a hydroxy group, there is described a method applying (a) the thermal imidation method, for example, a method for performing the imidation including: synthesizing an imide precursor in N-methyl-2-pyrrolidone (NMP); then adding an aromatic hydrocarbon solvent (such as m-xylene) that can be subjected to azeotropy with water as a dehydrating agent to the imide precursor; and heating the resultant mixture at 180° C. to subject the imide precursor to a dehydration reaction (Patent Document 2).

Or, as another method, there is also described, for example, a method for directly producing a polyhydroxyimide by heating an acid dianhydride and a diamine at a high temperature (180° C.) in a solvent mixture of an aprotic polar solvent (such as NMP) and a dehydration solvent (such as toluene) in the presence of an acid catalyst (γ-valerolactone) and a base (pyridine) to progress the reaction while subjecting a water content to azeotropy to remove the water content (Patent Document 3).

RELATED-ART DOCUMENT

Patent Document

Patent Document 1: Japanese Patent Application Publication No. JP-A-2-151629
Patent Document 2: Japanese Patent Application Publication No. JP-A-2005-173027
Patent Document 3: Japanese Patent Application Publication No. JP-A-2002-212287

DISCLOSURE OF THE INVENTION

Problem to be Solved by the Invention

As described above, when the polyhydroxyimide that is useful for a photosensitive resin composition is produced from a polyamic acid by a chemical imidation method, there is the problem that by a dehydrocondensing agent or a ring closing catalyst, a salt is generated (a hydroxy group becomes inactivated) and the time for a series of processing is long to require a long time for the production.

On the other hand, also in a thermal imidation method, there are many disadvantageous points from the viewpoint of the industrial production method, such as requiring such a high temperature as 180° C. during the production, requiring an azeotropic dehydration operation, and requiring the addition of a base or an azeotropic dehydration solvent also in a method for directly producing a polyhydroxyimide in comparison with a conventional production of a polyimide.

In order to solve the problems described above, it is an object of the present invention to provide a simple production method of a polyhydroxyimide for solving problems in a conventional chemical imidation method or thermal imidation method that is superior also from the viewpoint of the industrial production method.

Means for Solving the Problem

As a result of assiduous research intended to overcome these disadvantages, the inventor of the present invention has found that by adding a specific ester solvent to a polyhydroxyamic acid obtained by reacting a component selected from a tetracarboxylic acid and derivatives thereof with a diamine component having one or more hydroxy group(s), the production of a polyhydroxyimide under a neutral condition becomes possible without requiring the use of an acid and a base or an azeotropic dehydration operation.

That is, the present invention relates to, as a first aspect, a production method of a polyhydroxyimide, characterized by including: adding, to a polyhydroxyimide precursor containing a repeating structure of Formula (1):

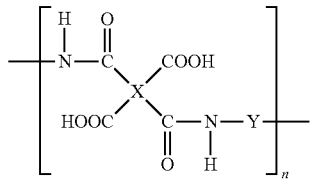

(1)

(where
X is a tetravalent aliphatic group or aromatic group,
Y is an organic group containing an aromatic group substituted with at least one OH group, and
n is an integer of 1 or more),
at least a compound of Formula (2) or Formula (3):

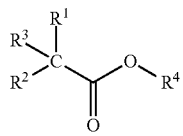

(2)

(where
$R^1$ to $R^3$ are independently a hydrogen atom, a $C_{1-10}$ alkyl group optionally interrupted with an oxygen atom, a $C_{1-10}$ haloalkyl group, a $C_{1-10}$ alkoxy group, an aryloxy group optionally substituted with W, a halogen atom, a nitro group, a cyano group, a hydroxy group, a phenyl group optionally substituted with W, a naphthyl group optionally substituted with W, a thienyl group optionally substituted with W, or a furyl group optionally substituted with W,
$R^4$ is a hydrogen atom, a $C_{1-10}$ alkyl group, a $C_{1-10}$ haloalkyl group, a phenyl group optionally substituted with W, a naphthyl group optionally substituted with W, a thienyl group optionally substituted with W, or a furyl group optionally substituted with W, and
W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group, or a sulfo group)

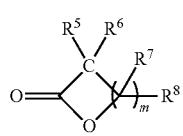

(3)

(where
m is a natural number,
$R^5$ to $R^8$ are independently a hydrogen atom, a $C_{1-10}$ alkyl group, a $C_{1-10}$ haloalkyl group, a $C_{1-10}$ alkoxy group, a halogen atom, a nitro group, a cyano group, a hydroxy group, a phenyl group optionally substituted with W, a naphthyl group optionally substituted with W, a thienyl group optionally substituted with W, or a furyl group optionally substituted with W, and W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group, or a sulfo group)
or both compounds of Formula (2) and Formula (3) and heating the resultant reaction mixture at a temperature of 50° C. or more to obtain a polyimide containing a repeating structure of Formula (4):

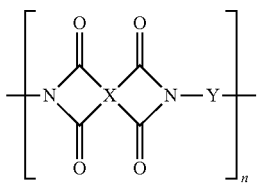

(4)

(where X, Y, and n are the same as defined above)
and having a weight average molecular weight measured by gel permeation chromatography (GPC) in terms of polystyrene of 5,000 to 100,000.

As a second aspect, the present invention relates to the production method of a polyhydroxyimide according to the first aspect, in which Y is an organic group containing a benzene ring substituted with at least one OH group.

As a third aspect, the present invention relates to the production method of a polyhydroxyimide according to the second aspect, in which Y contains at least one type of structure selected from the structures of Formula (5) to Formula (7):

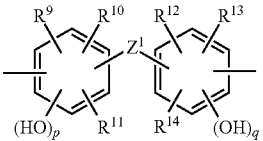

(5)

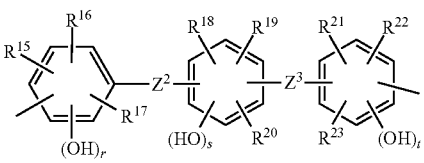

(6)

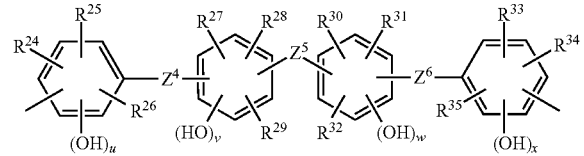

(7)

(where
$R^9$ to $R^{35}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W, W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group, or a sulfo group, $Z^1$ to $Z^6$ are a single bond, a $C_{1-10}$ alkylene group optionally substituted with $W^1$, —C(O)O—, —C(O)NH—, —O—, —S—, —S(O)$_2$—, or —C(O)—, $W^1$ is a $C_{1-10}$ alkyl group, a $C_{1-10}$ haloalkyl group, or a $C_{1-10}$ alkoxy group, and p to x are an integer of 1 or more and satisfy the equations: $2 \geq p+q \geq 1$; $2 \geq r+s+t \geq 1$; and $2 \geq u+v+w+x \geq 1$).

As a fourth aspect, the present invention relates to the production method of a polyhydroxyimide according to the third aspect, in which $Z^1$ to $Z^6$ are a single bond, —CH$_2$—, —C(CH$_3$)$_2$—, —C(CF$_3$)$_2$—, —C(O)NH—, —O—, —S(O)$_2$—, or —C(O)—.

As a fifth aspect, the present invention relates to the production method of a polyhydroxyimide according to any one of the first aspect to the fourth aspect, in which in Formula (2), $R^4$ is a methyl group or an ethyl group.

As a sixth aspect, the present invention relates to the production method of a polyhydroxyimide according to any one of the first aspect to the fifth aspect, in which in Formula (2), $R^1$ and $R^2$ are a methyl group.

As a seventh aspect, the present invention relates to the production method of a polyhydroxyimide according to any one of the first aspect to the sixth aspect, in which in Formula (2), any one of $R^1$ to $R^3$ is a hydroxy group, an alkoxy group, or a phenyl group, a naphthyl group, a thienyl group, or a furyl group each of which has a hydroxy group.

As an eighth aspect, the present invention relates to the production method of a polyhydroxyimide according to any one of the first aspect to the seventh aspect, in which the compound of Formula (2) is a compound having a boiling point of 70° C. or more and less than 200° C.

As a ninth aspect, the present invention relates to the production method of a polyhydroxyimide according to any one of the first aspect to the fourth aspect, in which the compound of Formula (3) is γ-butyrolactone.

As a tenth aspect, the present invention relates to the production method of a polyhydroxyimide according to any one of the first aspect to the ninth aspect, in which the compound of Formula (2) or Formula (3) or both compounds of Formula (2) and Formula (3) is(are) added in an amount of 50 parts by mass or more relative to 100 parts by mass of the polyhydroxyimide precursor containing a repeating structure of Formula (1).

As an eleventh aspect, the present invention relates to the production method of a polyhydroxyimide according to any one of the first aspect to the tenth aspect, in which the heating temperature is 50° C. to 120° C., As a twelfth aspect, the present invention relates to a polyhydroxyimide produced by the method as described in any one of the first aspect to the eleventh aspect.

As a thirteenth aspect, the present invention relates to a varnish containing the polyhydroxyimide as described in the twelfth aspect.

As a fourteenth aspect, the present invention relates to a coating film including the varnish as described in the thirteenth aspect.

As a fifteenth aspect, the present invention relates to a positive photosensitive resin composition containing the polyhydroxyimide as described in the twelfth aspect and 0.01 to 100 parts by mass of a photoacid generator relative to 100 parts by mass of the polyhydroxyimide.

As a sixteenth aspect, the present invention relates to the positive photosensitive resin composition according to the fifteenth aspect, further containing 200 parts by mass or less of a crosslinker relative to 100 parts by mass of the polyhydroxyimide.

As the inventor of the present invention has further progressed the study, the inventor of the present invention has also found that by applying the above production method of a polyhydroxyimide, that is, by following the same procedure and the same condition, a hydroxyimide can be produced.

That is, the present invention relates to, as a seventeenth aspect, a production method of a hydroxyimide, characterized by including: adding, to a hydroxyimide precursor of Formula (8):

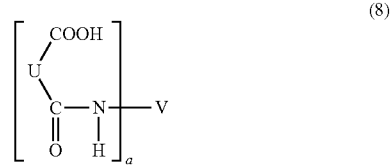

(where

U is a divalent aliphatic group or aromatic group,

V is an organic group containing an aromatic group substituted with at least one OH group, and a is an integer of 1 or 2), at least the compound of Formula (2) or Formula (3) as described in the first aspect or both compounds of Formula (2) and Formula (3) and heating the resultant reaction mixture at a temperature of 50° C. or more to obtain an imide of Formula (9):

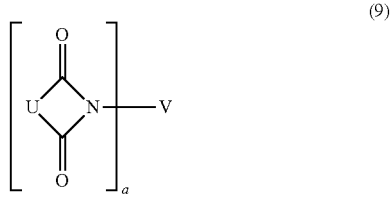

(where U, V, and a are the same as defined above).

As an eighteenth aspect, the present invention relates to the production method of a hydroxyimide according to the seventeenth aspect, in which V is an organic group containing a benzene ring substituted with at least one OH group.

As a nineteenth aspect, the present invention relates to the production method of a hydroxyimide according to the eighteenth aspect, in which V contains at least one type of structure selected from the structures of Formula (10) and Formula (11):

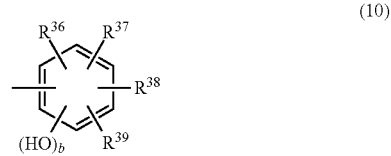

-continued

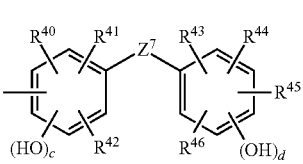

(11)

(where

R$^{36}$ to R$^{38}$ and R$^{40}$ to R$^{45}$ are independently a hydrogen atom, a C$_{1-10}$ alkyl group, a C$_{1-10}$ haloalkyl group, a C$_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W, R$^{39}$ to R$^{46}$ are independently a hydrogen atom, a C$_{1-10}$ alkyl group, a C$_{1-10}$ haloalkyl group, a C$_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W, W is the same as defined above, Z$^7$ is the same as Z$^1$, and b to d are an integer of 1 or more and satisfy the equations: 2≥b≥1 and 2≥c+d≥1).

As a twentieth aspect, the present invention relates to the production method of a hydroxyimide according to the nineteenth aspect, in which Z$^7$ is a single bond, —CH$_2$—, —C(CH$_3$)$_2$—, —C(CF$_3$)$_2$—, —C(O)NH—, —O—, —S(O)$_2$—, or —C(O)—.

As a twenty-first aspect, the present invention relates to the production method of a hydroxyimide according to any one of the seventeenth aspect to the twentieth aspect, in which in Formula (2), R$^4$ is a methyl group or an ethyl group.

As a twenty-second aspect, the present invention relates to the production method of a hydroxyimide according to any one of the seventeenth aspect to the twenty-first aspect, in which in Formula (2), R$^1$ and R$^2$ are a methyl group.

As a twenty-third aspect, the present invention relates to the production method of a hydroxyimide according to any one of the seventeenth aspect to the twenty-second aspect, in which any one of R$^1$ to R$^3$ is a hydroxy group, an alkoxy group, or a phenyl group, a naphthyl group, a thienyl group, or a furyl group each of which has a hydroxy group.

As a twenty-fourth aspect, the present invention relates to the production method of a hydroxyimide according to any one of the seventeenth aspect to the twenty-third aspect, in which the compound of Formula (2) is a compound having a boiling point of 70° C. or more and less than 200° C.

As a twenty-fifth aspect, the present invention relates to the production method of a polyhydroxyimide according to any one of the seventeenth aspect to the twentieth aspect, in which the compound of Formula (3) is γ-butyrolactone.

As a twenty-sixth aspect, the present invention relates to the production method of a hydroxyimide according to any one of the seventeenth aspect to the twenty-fifth aspect, in which the heating temperature is 50° C. to 120° C.

Effects of the Invention

By the production method of the present invention, without requiring a high temperature heating operation, an azeotropic dehydration operation, and the addition of a dehydrocondensing agent such as acetic anhydride, a ring opening catalyst such as pyridine, and an azeotropic dehydration solvent all of which have been conventionally regarded as required during the production of a polyhydroxyimide, a polyhydroxyimide can be easily produced from a polyhydroxyamic acid. Particularly, in the production of a polyhydroxyimide, by using the above additives, a phenolic hydroxy group in the side chains is converted into an acetoxy group, and consequently, a conversion operation into a hydroxy group becomes necessary again, so that the method of the present invention capable of obtaining a polyhydroxyimide by a one-step reaction is an extremely useful production method.

The production method of the present invention can progress the reaction under a neutral condition, and as an additive required for the polyimidation, the production method uses an ester solvent capable of being used conventionally as a solvent for a polyamic acid, so that the isolation-purification after the completion of the polyimide production is easy and the production method of the present invention becomes an industrial production method having high practicality.

By simplifying the above production process and by reducing the number of processes, a cost reduction or the like can also be achieved.

Further, according to the method of the present invention, not only a polyhydroxyimide, but also a hydroxyimide can be easily produced from a hydroxyamic acid under a neutral condition.

A coating film obtained from the varnish of the present invention can produce a positive pattern and the variation of the film thickness after development is small.

MODES FOR CARRYING OUT THE INVENTION

As described above, a conventional production method of a polyhydroxyimide has such problems as that a side reaction is effected and that the synthesis method is cumbersome. That is, in the chemical imidation method (using acetic anhydride and a base), there is the problem that a hydroxy group is converted into an acetoxy group, and in the thermal imidation method, there are the problem that a high temperature of near 200° C. is required, so that the thermal imidation method is not suitable for the mass production and the problem that a process such as an azeotropy operation becomes necessary. Accordingly, there is the problem that a conventional production method of a polyhydroxyimide is not suitable as an industrial production method when applying the polyhydroxyimide to a photosensitive resin composition.

The present invention is characterized by improving the problems in the above production method, for example, by using an ester solvent such as γ-butyrolactone. That is, the present invention relates to a production method of a polyhydroxyimide, characterized by obtaining a polyhydroxyimide containing a repeating structure of Formula (4) and having a weight average molecular weight measured by gel permeation chromatography (GPC) in terms of polystyrene of 5,000 to 100,000 by adding, to a polyhydroxyimide precursor containing a repeating structure of Formula (1), at least one type of specific ester solvent of Formula (2) or Formula (3) and by heating the resultant reaction mixture at a temperature of 50° C. or more.

Hereinafter, the detail will be described.

<Polyhydroxyimide Precursor>

The polyhydroxyimide precursor used in the present invention contains a repeating structure of Formula (1):

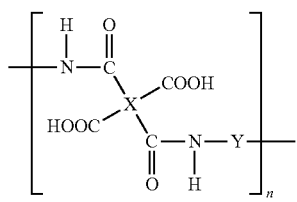

(1)

(where

X is a tetravalent aliphatic group or aromatic group,

Y is an organic group containing an aromatic group substituted with at least one OH group, and n is an integer of 1 or more).

In Formula (1), Y is preferably an organic group containing a benzene ring substituted with at least one OH group, particularly more preferably an organic group containing two or more benzene rings substituted with at least one OH group.

Examples of Y include groups having structures of Formulae (5) to (7):

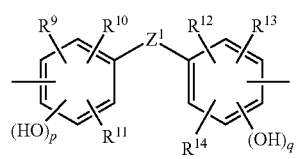

(5)

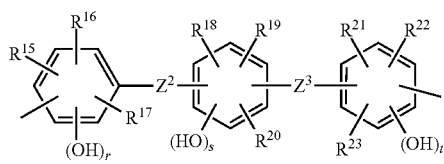

(6)

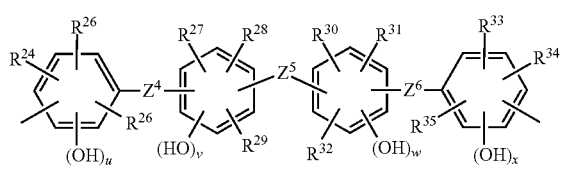

(7)

(where $R^9$ to $R^{35}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxy group, a phospho group, a sulfa group, a phenyl group optionally substituted with W, a naphthyl group optionally substituted with W, a thienyl group optionally substituted with W, or a furyl group optionally substituted with W, W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group, or a sulfo group, $Z^1$ to $Z^6$ are a single bond, a $C_{1-10}$ alkylene group optionally substituted with $W^1$, —C(O)O—, —C(O)NH—, —O—, —S—, —S(O)$_2$—, or —C(O)—, $W^1$ is a $C_{1-10}$ alkyl group, a $C_{1-10}$ haloalkyl group, or a $C_{1-10}$ alkoxy group, and p to x are an integer of 1 or more and satisfy the equations: 2≥p+q≥1; 2≥r+s+1; and 2≥u+v+w+x≥1).

In Formulae (5) to (7), $Z^1$ to $Z^6$ are preferably a single bond, —CH$_2$—, —C(CH$_3$)$_2$—, —C(CF$_3$)$_2$—, —C(O)NH—, —O—, —S(O)$_2$—, or —C(O)—.

Y is particularly preferably a group having an OH group at an o-position relative to an adjacent —NH group among Formulae (5) to (7).

The polyhydroxyimide precursor (polyhydroxyamic acid) containing a repeating structure of Formula (1) that is used in the present invention can be obtained, for example, by reacting a tetracarboxylic acid component with a diamine component.

Here, although the tetracarboxylic acid component and the diamine component used in the present invention are not particularly limited, from the viewpoint of the solubility of the obtained polyhydroxyimide precursor in an organic solvent or the like, at least any one of the tetracarboxylic acid component and the diamine component contains preferably a component having a fluorine- or sulfonyl group-having organic group in at least a part of the component. Although the fluorine-having organic group in the tetracarboxylic acid component or the diamine component is not particularly limited, the organic group is preferably a fluoro group, a fluoroalkyl group, or the like that is directly bonded to a benzene ring. Particularly, from the viewpoint of the solubility in a solvent or the like, the tetracarboxylic acid component or the diamine component having a trifluoromethyl group or a hexafluoroisopropylidene group is preferred. To these organic groups, one fluorine atom or a plurality of fluorine atoms is(are) optionally bonded.

[Tetracarboxylic Acid Component]

The tetracarboxylic acid component capable of being used as a monomer component constituting the polyhydroxyimide precursor (polyhydroxyamic acid) containing a repeating structure of Formula (1) that is used for the production method of the present invention is not particularly limited so long as the tetracarboxylic acid component is a tetracarboxylic acid, an acid dianhydride of the tetracarboxylic acid, or a compound derived from the tetracarboxylic acid or the acid dianhydride. Specific examples thereof are mentioned as follows.

Specific examples of the tetracarboxylic acid component include such compounds as: an aromatic tetracarboxylic acid such as pyromellitic acid, 3,3',4,4'-biphenyl tetracarboxylic acid, 3,3',4,4'-benzophenone tetracarboxylic acid, 3,3',4,4'-diphenyl ether tetracarboxylic acid, 3,3',4,4'-diphenylsulfone tetracarboxylic acid, and 3,4-dicarboxy-1,2,3,4-tetrahydro-1-naphthalene succinic acid, a dianhydride of the acid, and derivatives of the acid or the dianhydride; an alicyclic tetracarboxylic acid such as 1,2,3,4-cyclobutane tetracarboxylic acid, 1,2-dimethyl-1,2,3,4-cyclobutane tetracarboxylic acid, 1,2,3,4-tetramethyl-1,2,3,4-cyclobutane tetracarboxylic acid, 1,2,3,4-cyclopentane tetracarboxylic acid, 1,2,4,5-cyclohexane tetracarboxylic acid, 5-(2,5-dioxotetrahydrofuryl)-3-methyl-3-cyclohexene-1,2-dicarboxylic acid, 2,3,5-tricarboxy-2-cyclopentane acetic acid, bicyclo[2.2.2]oct-7-ene-2,3,5,6-tetracarboxylic acid, 2,3,4,5-tetrahydrofuran tetracarboxylic acid, and 3,5,6-tricarboxy-2-norbomane acetic acid, a dianhydride of the acid, and derivatives of the acid or the dianhydride; and an aliphatic tetracarboxylic acid such as 1,2,3,4-butane tetracarboxylic acid, a dianhydride of the acid, and derivatives of the acid or the dianhydride. Further, examples of the tetracarboxylic acid component having a fluorine-having organic group include 2,2-bis(3,4-dicarboxyphenyl)hexafluoroisopropylidene and 4,4'-hexafluoroisopropylidene diphthalic acid that have a trifluoromethyl group and a hexafluoroisopropylidene group, and examples of the tetracarboxylic acid component having a sulfonyl group-having organic group include compounds such as 3,3',4,4'-diphenylsulfone tetracarboxylic acid, a dianhydride of the acid, and derivatives of the acid or the dianhydride, to which the examples are not limited.

As the tetracarboxylic acid component, one type or two or more types of compound(s) among the above tetracarboxylic acids, dianhydrides of the acids, and derivatives of the acids or the dianhydrides can be combined to be used.

[Diamine Component]

The diamine component that is a monomer component constituting the polyhydroxyimide precursor (polyhydroxyamic acid) containing a repeating structure of Formula (1) that is used for the production method of the present invention is a diamine containing an aromatic group substituted with at least one OH group.

The diamine containing an aromatic group substituted with at least one OH group is not particularly limited and examples thereof include 3,3'-diamino-4,4'-dihydroxybiphenyl (4BP), 3,3'-diamino-2,2'-dihydroxybiphenyl (2BP), 2,2'-bis(3-amino-4-hydroxyphenyl)hexafluoropropane (BAHF), 2,2-bis(4-amino-3,5-dihydroxyphenyl)hexafluoropropane, 2,2-bis[4-(3-amino-4-hydroxyphenoxy)phenyl]hexafluoropropane, bis(3-amino-4-hydroxyphenyl)methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl)propane (BAPA), (3-amino-4-hydroxy)phenyl(3-amino-4-hydroxy)anilide (AHPA), bis(3-amino-4-hydroxyphenyl)sulfone (BSDA), bis-N,N'-(p-aminobenzoyl)-hexafluoro-2,2'-bis(4-hydroxyphenyl)propane (BABHBPA), [4-(4-aminophenoxy)phenyl]sulfone, 2,4-diaminophenol, 3,5-diaminophenol, 2,5-diaminophenol, 4,6-diaminoresorcinol, 2,5-diaminohydroquinone, bis(3-amino-4-hydroxyphenyl)thioether, bis(4-amino-3,5-dihydroxyphenyl)thioether, bis(3-amino-4-hydroxyphenyl)ether, bis(4-amino-3,5-dihydroxyphenyl)ether, bis(3-amino-4-hydroxyphenyl)methane, bis(4-amino-3,5-dihydroxyphenyl)methane, bis(4-amino-3,5-dihydroxyphenyl)sulfone, 4,4'-diamino-3,3'-dihydroxybiphenyl (3 BP), 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy)benzene, 1,3-bis(3-amino-4-hydroxyphenoxy) benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone, bis[4-(3-amino-4-hydroxyphenoxy)phenyl]propane, and 1,4-bis(4-aminophenoxy)benzene, to which the examples are not limited.

Among the above diamine components, preferred examples thereof include 3,3'-diamino-4,4'-dihydroxybiphenyl (4BP), 3,3'-diamino-2,2'-dihydroxybiphenyl (2BP), 2,2'-bis(3-amino-4-hydroxyphenyl)hexafluoropropane (BAHF), 2,2-bis(4-amino-3,5-dihydroxyphenyl)hexafluoropropane, 2,2-bis[4-(3-amino-4-hydroxyphenoxy)phenyl]hexafluoropropane, bis(3-amino-4-hydroxyphenyl)methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl)propane (BAPA), (3-amino-4-hydroxy)phenyl(3-amino-4-hydroxy)anilide (AHPA), bis(3-amino-4-hydroxyphenyl)sulfone (BSDA), bis-N,N'-(p-aminobenzoyl)-hexafluoro-2,2'-bis(4-hydroxyphenyl)propane (BABHBPA), [4-(4-aminophenoxy)phenyl]sulfone, 2,4-diaminophenol, 2,5-diaminophenol, 4,6-diaminoresorcinol, 2,5-diaminohydroquinone, bis(3-amino-4-hydroxyphenyl)thio ether, bis(4-amino-3,5-dihydroxyphenyl)thio ether, bis(3-amino-4-hydroxyphenyl) ether, bis(3-amino-4-hydroxyphenyl)methane, 4,4'-diamino-3,3'-dihydroxybiphenyl (3BP), 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy)benzene, 1,3-bis(3-amino-4-hydroxyphenoxy) benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone, bis[4-(3-amino-4-hydroxyphenoxy)phenyl]propane, and 1,4-bis(4-aminophenoxy)benzene.

Particularly preferred examples thereof include bis(3-amino-4-hydroxyphenyl)methane (BAPF), 2,2'-bis(3-amino-4-hydroxyphenyl)propane (BAPA), 2,2'-bis(3-amino-4-hydroxyphenyl)hexafluoropropane (BAHF), 3,3'-diamino-4,4'-dihydroxy-phenyl ether (AHPE), 3,3'-diamino-4,4'-dihydroxybenzophenone (AHPK), bis(3-amino-4-hydroxyphenyl)sulfone (BSDA), (3-amino-4-hydroxy)phenyl(3-amino-4-hydroxy)anilide (AHPA), and bis-N,N'-(p-aminobenzoyl)-hexafluoro-2,2'-bis(4-hydroxyphenyl)propane (BABHBPA).

Further, in addition to the diamine containing an aromatic group substituted with at least one OH group that is a diamine component as a monomer component constituting the polyhydroxyimide precursor (polyhydroxyamic acid) used for the production method of the present invention, a siloxane-containing diamine can also be used. By using a siloxane-containing diamine in combination, adhesion of the obtained coating film containing the polyhydroxyimide precursor to a substrate can be enhanced.

Particularly preferred examples of the siloxane-containing diamine include siloxane-containing diamines of Formula (12):

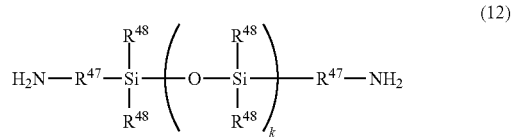

(where
R$^{47}$ is a divalent organic group,
R$^{48}$s are independently a monovalent organic group, and
k is an integer of 1 or more),
and among them, bis(3-aminopropyl)-1,1,3,3-tetramethyldisiloxane (APDS) is more preferred.

As the diamine component that is a monomer component constituting the polyhydroxyimide precursor (polyhydroxyamic acid) used for the production method of the present invention, in addition to the diamine containing an aromatic group substituted with at least one OH group and the siloxane-containing diamine of Formula (12), other diamines can also be used.

Although the other diamine component is not particularly limited, preferred is a diamine containing an aromatic group, and particularly, a diamine containing one or more benzene ring(s) is more preferred.

As the other diamine, examples of the diamine containing an aromatic group include p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether (ODA), 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4-methylene-bis(2-methylaniline), 4,4'-methylene-bis(2,6-dimethylaniline), 4,4-methylene-bis(2,6-diethylaniline), 4,4'-methylene-bis(2-isopropyl-6-methylaniline), 4,4'-methylene-bis(2,6-diisopropylaniline), 4,4'-diaminodiphenyl sulfone, 3,3'-diaminodiphenyl sulfone, benzidine, m-tolidine, 3,3'5,5'-tetramethylbenzidine, 1,4-bis(4-aminophenoxy)benzene, 1,3-bis(4-aminophenoxy)benzene (DA4P), 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane.

Among them, particularly preferred examples thereof include 4,4'-diaminodiphenyl ether (ODA) and 1,3-bis(4-aminophenoxy)benzene (DA4P).

[Production Method of Polyhydroxyimide Precursor]

The polyhydroxyimide precursor (polyhydroxyamic acid) used for the production method of the present invention can be obtained by subjecting the tetracarboxylic acid component and the diamine component (a diamine containing an aromatic group substituted with at least one OH group and, if desired, another diamine component and/or a siloxane-containing diamine) to a polymerization reaction in an organic solvent.

Although the organic solvent used for the polymerization reaction is not particularly limited so long as the solvent can dissolve the generated polyhydroxyimide precursor, when dared to mention specific examples thereof, specific examples thereof include a polar solvent such as γ-butyrolactone and diglyme. The compound of Formula (2) or Formula (3) or both compounds of Formula (2) and Formula (3) (ester solvent) that is(are) used for the production of a polyimide described below can also be used, and in this case, the polyhydroxyimide precursor solution as it is can be used for the production of a polyhydroxyimide. These solvents are optionally used individually or in combination of two or more types thereof. Further, even a solvent not dissolving the polyhydroxyimide precursor is optionally mixed in the above solvent in a range in which the generated polyhydroxyimide precursor is not deposited.

The lower limit of the temperature range for the reaction between the tetracarboxylic acid component and the diamine component is ordinarily −20° C. or more, preferably −5° C. or more. The upper limit of the temperature range is ordinarily 150° C. or less, preferably 100° C. or less, and from the range between the upper limit and the lower limit, an arbitrary temperature can be selected. Preferably at room temperature, the tetracarboxylic acid component and the diamine component are reacted with each other.

Although when the reaction temperature is set at a high temperature, the polymerization reaction is rapidly progressed and completed, when the reaction temperature is too high, there is the case where a high molecular weight polyhydroxyimide precursor cannot be obtained.

In the reaction effected in an organic solvent, although the solid content concentration of the both components (tetracarboxylic anhydride component and diamine component) in the solvent is not particularly limited, when the concentration is too low, a high molecular weight polyhydroxyimide precursor becomes difficult to be obtained. On the other hand, when the concentration is too high, the viscosity of the reaction solution becomes too high, so that a homogeneous stirring of the reaction solution becomes difficult. Therefore, the solid content concentration of each component is preferably 1 to 50% by mass, more preferably 5 to 30% by mass. It is also possible that in the initial stage of the polymerization reaction, the reaction is effected with a high concentration of the solid content, and following the purification of the polymer (polyhydroxyimide precursor), then, an organic solvent is further added.

The thus obtained polyhydroxyimide precursor-containing solution as it is can be used for the preparation of a polyhydroxyimide described below. The polyhydroxyimide precursor can be precipitation-isolated in a poor solvent such as water, methanol, and ethanol to be recovered to be used.

[Ester Solvent]

The ester solvent used in the present invention is a compound having a structure of Formula (2) or Formula (3):

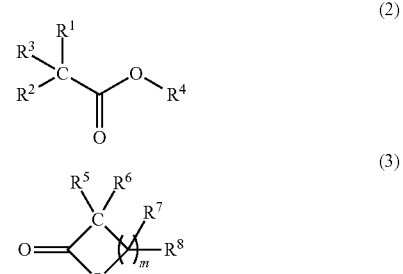

{in Formula (2), $R^1$ to $R^3$ are independently a hydrogen atom, a $C_{1-10}$ alkyl group optionally interrupted with an oxygen atom, a $C_{1-10}$ haloalkyl group, a $C_{1-10}$ alkoxy group, an aryloxy group optionally substituted with W, a halogen atom, a nitro group, a cyano group, a hydroxy group, a phenyl group optionally substituted with W, a naphthyl group optionally substituted with W, a thienyl group optionally substituted with W, or a furyl group optionally substituted with W;

$R^4$ is a hydrogen atom, a $C_{1-10}$ alkyl group, a $C_{1-10}$ haloalkyl group, a phenyl group optionally substituted with W, a naphthyl group optionally substituted with W, a thienyl group optionally substituted with W, or a furyl group optionally substituted with W; and W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group, or a sulfo group, in Formula (3), m is a natural number;

$R^5$ to $R^8$ are independently a hydrogen atom, a $C_{1-10}$ alkyl group, a $C_{1-10}$ haloalkyl group, a $C_{1-10}$ alkoxy group, a halogen atom, a nitro group, a cyano group, a hydroxy group, a phenyl group optionally substituted with W, a naphthyl group optionally substituted with W, a thienyl group optionally substituted with W, or a furyl group optionally substituted with W; and W is the same as defined above}.

In Formula (2), preferably $R^4$ is a methyl group or an ethyl group, more preferably, $R^1$ and $R^2$ are a methyl group and any one of $R^1$ to $R^3$ is a hydroxy group, an alkoxy group, or a phenyl group, a naphthyl group, a thienyl group, or a furyl group that has a hydroxy group. The compound of Formula (2) is preferably an ester solvent having a boiling point of 70° C. or more and less than 200° C.

Specific examples of the compound of Formula (2) include ethyl acetate, methyl methoxyacetate, ethyl methoxyacetate, methyl 2-hydroxyisobutyrate, ethyl 2-hydroxyisobutyrate, methyl 2-(4-chlorophenoxy)isobutyrate, methyl glycolate, methyl lactate, ethyl lactate, propylene glycol monomethyl ether acetate, propylene glycol monoethyl ether acetate, ethylene glycol monomethyl ether acetate, and ethylene glycol monoethyl ether acetate.

In Formula (3), preferably, $R^5$ to $R^8$ are a hydrogen atom, a methyl group, or a hydroxy group.

Specific examples of the compound of Formula (3) include γ-butyrolactone, γ-valerolactone, γ-caprolactone, γ-octalactone, 3,5-dihydroxy-3-methylvaleric acid, δ-lactone, δ-methyl-δ-valerolactone, β-propiolactone, β-butyrolactone, 3-hydroxy-γ-butyrolactone, α-methyl-γ-butyrolactone, α-ethyl-γ-butyrolactone, α-propyl-γ-butyrolactone, α-hexyl-γ-butyrolactone, and α-heptyl-γ-butyrolactone. Among them, from the viewpoint of the productivity, γ-butyrolactone is more preferred.

The compound of Formula (2) or Formula (3) is preferably added in an amount of 50 parts by mass or more, more preferably 100 parts by mass or more, relative to 100 parts by mass of the polyhydroxyimide precursor containing a repeating structure of Formula (1).

<Production Method of Polyhydroxyimide>

The production method of a polyhydroxyimide of the present invention is in detail a method for obtaining a polyhydroxyimide containing a repeating structure of Formula (4) and having a weight average molecular weight measured by gel permeation chromatography (GPC) in terms of polystyrene of 5,000 to 100,000 by heating the polyhydroxyimide precursor containing a repeating structure of Formula (1) at a temperature of 50° C. or more in the compound of Formula (2) or Formula (3) or both compounds of Formula (2) and Formula (3) (ester solvent) to react the polyhydroxyimide precursor.

The heating temperature is preferably 50° C. or more and 120° C. or less, more preferably 70° C. or more and 120° C. or less.

By heating the polyhydroxyimide precursor at the temperature for 18 hours to 48 hours, the polyimidation reaction is progressed.

Here, for example, by heating a reaction system in which the tetracarboxylic acid component and the diamine component are blended in the compound of Formula (2) or Formula (3) or both compounds of Formula (2) and Formula (3) (ester solvent) at a temperature of 50° C. or more, following the production of the polyhydroxyimide precursor, the polyhydroxyimidation reaction can also be progressed.

As the method for recovering the thus obtained polyhydroxyimide, a method by charging the reaction solution into a stirred poor solvent to precipitate the polyhydroxyimide and filtering the precipitate is simple.

Although the poor solvent used here is not particularly limited, examples thereof include methanol, hexane, heptane, ethanol, toluene, methylene chloride, and water. After recovering the precipitate by filtration, the precipitate is preferably washed with the poor solvent.

The recovered polyhydroxyimide can be dried under normal pressure or reduced pressure at a normal temperature or by heating to be converted into a polyhydroxyimide powder.

By repeating twice to ten times an operation in which the polyhydroxyimide powder is further dissolved in a good solvent and the resultant solution is re-precipitated in a poor solvent, impurities in the polymer can be further reduced.

Although the good solvent used here is not particularly limited so long as the solvent can dissolve the polyhydroxyimide, examples thereof include N,N-dimethylformamide, N,N-dimethylacetamide, 2-pyrrolidone, N-methyl-2-pyrrolidone, N-ethyl-2-pyrrolidone, N-vinyl-2-pyrrolidone, N-methylcaprolactam, dimethylsulfoxide, tetramethylurea, pyridine, and γ-butyrolactone.

As the poor solvent used for re-precipitation, when three or more types of poor solvents such as alcohols, ketones, and hydrocarbons are used, the efficiency of the purification is further more enhanced.

[Polyhydroxyimide-Containing Varnish]

The polyhydroxyimide obtained by the production method of the present invention can be dissolved in a solvent to be converted into a state of a varnish.

Examples of the solvent used for converting the polyhydroxyimide into the state of a varnish include: an ester solvent such as diethyl oxalate, ethyl acetoacetate, ethyl acetate, isobutyl acetate, ethyl butyrate, ethyl lactate, ethyl 3-methoxypropionate, ethyl 2-hydroxyisobutyrate, methyl 2-hydroxyisobutyrate, and 4-butyrolactone; a ketone solvent such as ethyl methyl ketone, isobutyl methyl ketone, 2-hexanone, cyclohexanone, and γ-butyrolactone; a propylene glycol solvent such as propylene glycol monomethyl ether and propylene glycol monomethyl ether acetate; a cellosolve solvent such as methylcellosolve and methylcellosolve acetate; an ether solvent such as dibutyl ether, tetrahydrofuran, and 1,4-dioxane; an alcohol solvent such as ethanol, isopropanol, and isopentyl alcohol; an aromatic hydrocarbon solvent such as toluene and xylene; a halogenated hydrocarbon solvent such as dichloromethane, chloroform, 1,2-dichloroethane, and trichloroethylene; and an amide solvent such as N,N-dimethylformamide, N,N-dimethylacetamide, 2-pyrrolidone, N-methyl-2-pyrrolidone, N-ethyl-2-pyrrolidone, methoxy-N-isopropyl-propionamide, ethoxy-N-isopropyl-propionamide, propoxy-N-isopropyl-propionamide, butoxy-N-isopropyl-propionamide, methoxy-N-propyl-propionamide, ethoxy-N-propyl-propionamide, propoxy-N-propyl-propionamide, butoxy-N-propyl-propionamide, methoxy-N,N'-dipropyl-propionamide, ethoxy-N,N'-dipropyl-propionamide, propoxy-N,N'-dipropyl-propionamide, and butoxy-N,N'-dipropyl-propionamide. These solvents are optionally used individually or, if necessary, in combination of two or more types thereof.

The reaction solution after the completion of the reaction as it is (without isolating the polyhydroxyimide) can be used as the varnish. At this time, the solvent can also be added.

Although the concentration of the polyhydroxyimide dissolved in the solvent is arbitrary, the concentration of the polyhydroxyimide is 0.01 to 40 parts by mass, preferably 0.1 to 30 parts by mass relative to 1 part by mass of the solvent. This is because, when the amount of the polyhydroxyimide is lower than 0.01 parts by mass, the varnish has a low viscosity, and on the other hand, when the amount of the polyhydroxyimide is higher than 40 parts by mass, the varnish has a high viscosity, so that in both cases the polyhydroxyimide becomes difficult to be handled.

In the varnish of the present invention, further a photoacid generator and a crosslinker are optionally blended. These agents are optionally used individually or, if necessary, in combination of two or more types thereof.

The photoacid generator is not particularly limited with respect to the type and the structure thereof so long as the photoacid generator has a function of generating an acid directly or indirectly by irradiation of a light used for exposure and the like and enhancing the solubility of a light irradiated-part in an alkali developer. The photoacid generator is optionally used individually or in combination of two or more types thereof.

As the photoacid generator, any one of publicly known photoacid generators can be applied and specific examples thereof include an o-quinonediazide compound, an allyl diazonium salt, a diallyl iodonium salt, a triallyl sulfonium salt, an o-nitrobenzyl ester, a p-nitrobenzyl ester, a trihalomethyl group-substituted s-triazine derivative, and an imide sulfonate derivative.

If necessary, the photoacid generator can be used in combination with a sensitizer. Examples of the sensitizer include perylene, anthracene, thioxanthone, Michler's ketone, benzophenone, and fluorene, to which the examples are not limited.

Among these photoacid generators, in terms of capable of obtaining a high sensitivity and a high resolution with respect to the coating film obtained using the positive photosensitive resin composition, an o-quinonediazide compound is desired.

The o-quinonediazide compound is ordinarily obtained by subjecting o-quinonediazidesulfonyl chloride and a compound having at least one group selected from a hydroxy group and an amino group to a condensation reaction in the presence of a basic catalyst, as an o-quinonediazidesulfonic acid ester or o-quinonediazidesulfonamide.

Examples of the o-quinonediazidesulfonic acid component constituting o-quinonediazidesulfonyl chloride include 1,2-naphthoquinone-2-diazide-4-sulfonic acid, 1,2-naphthoquinone-2-diazide-5-sulfonic acid, and 1,2-naphthoquinone-2-diazide-6-sulfonic acid.

Specific examples of the compound having a hydroxy group include: a phenol compound such as phenol, o-cresol, m-cresol, p-cresol, hydroquinone, resorcinol, catechol, o-methoxyphenol, 4,4-isopropylidenediphenol, 1,1-bis(4-hydroxyphenyl)cyclohexane, 4,4'-dihydroxyphenylsulfone, 4,4-hexafluoroisopropylidenediphenol, 4,4',4"-trihydroxytriphenylmethane, 1,1,1-tris(4-hydroxyphenyl)ethane, 4,4'-[1-[4-[1-(4-hydroxyphenyl)-1-methylethyl]phenyl]ethylidene]bisphenol, methyl 3,4,5-trihydroxybenzoate, propyl 3,4,5-trihydroxybenzoate, isoamyl 3,4,5-trihydroxybenzoate ester, 2-ethylbutyl 3,4,5-trihydroxybenzoate ester, 2,4-dihydroxybenzophenone, 2,3,4-trihydroxybenzophenone, 2,2',4,4'-tetrahydroxybenzophenone, 2,3,4,4'-tetrahydroxybenzophenone, and 2,3,4,2',4'-pentahydroxybenzophenone; and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate, and butyl lactate.

Examples of the compound having an amino group include: anilines such as aniline, o-toluidine, m-toluidine, p-toluidine, 4-aminodiphenylmethane, 4-aminodiphenyl, o-phenylenediamine, m-phenylenediamine, p-phenylenediamine, 4,4'-diaminodiphenylmethane, and 4,4'-diaminodiphenyl ether; and aminocyclohexane.

Specific examples of the compound having both a hydroxy group and an amino group include: aminophenols such as o-aminophenol, m-aminophenol, p-aminophenol, 4-aminoresorcinol, 2,3-diaminophenol, 2,4-diaminophenol, 4,4'-diamino-4"-hydroxytriphenylmethane, 4-amino-4',4"-dihydroxytriphenylmethane, bis(4-amino-3-carboxy-5-hydroxyphenyl) ether, bis(4-amino-3-carboxy-5-hydroxyphenyl)methane, bis(4-amino-3-carboxy-5-hydroxyphenyl)sulfone, 2,2-bis(4-amino-3-carboxy-5-hydroxyphenyl)propane, and 2,2-bis(4-amino-3-carboxy-5-hydroxyphenyl)hexafluoropropane; and alkanolamines such as 2-aminoethanol, 3-aminopropanol, and 4-aminocyclohexanol.

By subjecting o-quinonediazidesulfonyl chloride and a compound having at least one group selected from a hydroxy group and an amino group to a condensation reaction, there is obtained a di-substituted, tri-substituted, tetra-substituted, or penta-substituted o-quinonediazide compound in which a part or all of the hydroxy group or the amino group of the compound is(are) substituted with an o-quinonediazidesulfonyl group of o-quinonediazidesulfonyl chloride. When such an o-quinonediazide compound is used as one component of a positive photosensitive resin composition, it is general that the multi-substituted o-quinonediazide compound is used either individually or as a mixture of two or more types of multi-substituted compounds selected from the above multi-substituted compounds.

Among the above o-quinonediazide compounds, from the viewpoint that in a coating film obtained using the positive photosensitive resin composition, the balance of the difference in the developer solubility between an exposed part and an unexposed part is advantageous, and a developer residue at a bottom of a pattern (residue at a pattern edge part) is not caused during development, an o-quinonediazidesulfonic acid ester of p-cresol, an o-quinonediazidesulfonic acid ester of 4,4'-[1-[4-[1-(4-hydroxyphenyl)-1-methylethyl]phenyl] ethylidene]bisphenol, an o-quinonediazidesulfonic acid ester of methyl 3,4,5-trihydroxybenzoate, an o-quinonediazidesulfonic acid ester of 2,3,4-trihydroxybenzophenone, an o-quinonediazidesulfonic acid ester of 2,3,4,4'-tetrahydroxybenzophenone, and the like are desired. These compounds are optionally used individually or in combination of two or more types optionally selected from these compounds.

The content of the photoacid generator used in the present invention is 0.01 to 100 parts by mass relative to 100 parts by mass of the polyhydroxyimide. In a coating film obtained from the positive photosensitive resin composition of the present invention, in terms that the balance of the difference in the developer solubility between an exposed part and an unexposed part becomes advantageous and from the viewpoints of the sensitivity of the coating film and the mechanical properties of a cured film obtained from the coating film, the content of the photoacid generator is particularly desirably 70 parts by mass or less, more desirably 50 parts by mass or less.

On the other hand, examples of the crosslinker include: a maleimide compound such as 2,2-bis(3-amino-4-maleimide) hexafluoropropane, 4,4'-dimaleimide diphenyl ether, 3,4'-dimaleimide diphenyl ether, 3,3'-dimaleimide diphenyl ether, 4,4'-dimaleimide diphenyl sulfide, 4,4'-dimaleimide diphenyl methane, 3,4'-dimaleimide diphenyl methane, 3,3'-dimaleimide diphenyl methane, 4,4-methylene-bis(2-methylmaleimide), 4,4'-dimaleimide diphenyl sulfone, 3,3'-dimaleimide diphenyl sulfone, 1,4'-bis(4-maleimidephenoxy)benzene, 1,3'-bis(4-maleimidephenoxy) benzene, 1,3'-bis(4-maleimidephenoxy)benzene, bis[4-(4-maleimidephenoxy)phenyl]sulfone, bis[4-(3-maleimidephenoxy)phenyl]sulfone, bis[3-(4-maleimidephenoxy)phenyl]sulfone, bis[3-(3-maleimidephenoxy)phenyl]sulfone, 2,2'-bis[4-(4-maleimidephenoxy)phenyl]propane, and 2,2-bis[4-(3-aminophenoxy)phenyl]propane; an epoxy compound having a cyclohexene structure such as Epolead GT-401, Epolead GT-403, Epolead GT-301, Epolead GT-302, Celloxide 2021, and Celloxide 3000 (manufactured by Daicel Chemical Industries, Ltd.); a bisphenol A-type epoxy compound such as Epikote 1001, Epikote 1002, Epikote 1003, Epikote 1004, Epikote 1007, Epikote 1009, Epikote 1010, and Epikote 828 (manufactured by Japan Epoxy Resins Co., Ltd.); a bisphenol F-type epoxy compound such as Epikote 807 (manufactured by Japan Epoxy Resins Co., Ltd.); a phenolnovolac-type epoxy compound such as Epikote 152 and Epikote 154 (manufactured by Japan Epoxy Resins Co., Ltd.) and EPPN 201 and EPPN 202 (manufactured by Nippon Kayaku Co., Ltd.); a cresolnovolac-type epoxy compound such as ECON-102, ECON-103S, ECON-104S, ECON-1020, ECON-1025, ECON-1027 (manufactured by Nippon Kayaku Co., Ltd.), and Epikote 180S75 (manufactured by Japan Epoxy Resins Co., Ltd.); an alicyclic epoxy compound such as Denacol EX-252 (manufactured by Nagase ChemteX Corporation), CY175, CY177, CY179, Araldite CY-182, Araldite CY-192, Araldite CY-184 (manufactured by Ciba-Geigy A.G), Epiclon 200, Epiclon 400 (DIC Corporation (formerly, Dainippon Ink & Chemicals Inc.)), Epikote 871, Epikote 872 (manufactured by Japan Epoxy Resins Co., Ltd.), ED-5661, and ED-5662 (manufactured by Celanese Coating Co.); and an aliphatic polyglycidyl ether compound such as Denacol EX-611, Denacol EX-612, Denacol EX-614, Denacol EX-622, Denacol EX-411, Denacol EX-512, Denacol EX-522, Denacol EX-421, Denacol EX-313, Denacol EX-314, and Denacol EX-312 (manufactured by Nagase ChemteX Corporation).

Examples of the crosslinker also include: MX-750 in which 3.7 (in an average number) methoxymethyl groups per one triazine ring are substituted and MW-30 in which 5.8 (in an average number) methoxymethyl groups per one triazine ring are substituted (both, manufactured by Sanwa Chemical Co., Ltd.); a methoxymethylated melamine such as Cymel 300, Cymel 301, Cymel 303, Cymel 350, Cymel 370, Cymel 771, Cymel 325, Cymel 327, Cymel 703, and Cymel 712; a methoxymethylated butoxymethylated melamine such as Cymel 235, Cymel 236, Cymel 238, Cymel 212, Cymel 253, and Cymel 254; a butoxymethylated melamine such as Cymel 506 and Cymel 508; a carboxy group-containing methoxymethylated isobutoxymethylated melamine such as Cymel 1141; a methoxymethylated ethoxymethylated benzoguanamine such as Cymel 1123; a methoxymethylated butoxymethylated benzoguanamine such as Cymel 1123-10; a butoxymethylated benzoguanamine such as Cymel 1128; a carboxy group-containing methoxymethylated ethoxymethylated benzoguanamine such as Cymel 1125-80 (manufactured by Nihon Cytec Industries, Inc. (formerly, Mitsui Cyanamid); a butoxymethylated glycoluryl such as Cymel 1170; and a methylolated glycoluryl such as Cymel 1172.

Although the content of the crosslinker used in the present invention is not particularly limited, from the viewpoint of the mechanical properties of the obtained coating film, the content of the crosslinker is particularly desirably 200 parts by mass or less, and from the viewpoint of the preservation stability, the content of the crosslinker is more desirably 100 parts by mass or less, relative to 100 parts by mass of polyhydroxyimide.

The varnish of the present invention can further contain a surfactant. The surfactant can further enhance the applicability of the varnish relative to a substrate.

Specific examples of the surfactant include: nonionic surfactants, for example polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example EFTOP EF301, ditto EF303, and ditto EF352 (manufactured by Mitsubishi Materials Electronic Chemicals Co., Ltd. (formerly, Jemco Inc.)), MEGAFAC F171, ditto F173, ditto F 176, ditto F 189, and ditto R 30 (manufactured by DIC Corporation (formerly, Dainippon Ink & Chemicals Inc.)), Fluorad FC430 and ditto FC431 (manufactured by Sumitomo 3M Limited), AsahiGuard AG710 and Surflon S-382, ditto SC101, ditto SC102, ditto SC103, ditto SC104, ditto SC105, and ditto SC106 (manufactured by Asahi Glass Co., Ltd.); Organosiloxane polymer KP-341 (manufactured by Shin-Etsu Chemical Co., Ltd.); and Ftergent 206D, ditto 212D, ditto 218D, and ditto 220P (manufactured by Neos Company Limited), to which the examples are not limited. These surfactants are optionally used individually or in combination of two or more types thereof.

The concentration of the surfactant is ordinarily 1 part by mass or less, preferably 0.1 parts by mass or less, more preferably 0.01 parts by mass or less, relative to 1 part by mass of the solvent.

[Coating Film Formed from Varnish Containing Polyhydroxyimide]

As a specific method for forming a thin film using the varnish of the present invention, the thin film can be obtained by a method including: dissolving the polyhydroxyimide obtained by the production method of the present invention in the solvent to convert the polyhydroxyimide into a state of a varnish (film forming material); applying the varnish on a substrate by a roll coating method, a micro gravure coating method, a gravure coating method, a flow coating method, a bar coating method, a spray coating method, a die coating method, a spin coating method, a dip coating method, a doctor blade method, a Langmuir-Blodgett method, or the like; and, if necessary, drying the resultant coating.

Examples of the substrate include a plastic such as polycarbonate, polymethacrylate, polystyrene, polyester, polyolefin, epoxy, acryl, melamine, triacetylcellulose, ABS, AS, and a norbornen-based resin; a metal; a glass; and a silicon.

The applying method is not particularly limited and the optimal applying method can be selected from the above applying methods taking into consideration the balance between the productivity, the film thickness controlling property, the yield, and the like.

The drying temperature is preferably 40 to 300° C. From these temperatures, the optimal drying temperature can be selected taking into consideration the solvent type, the solvent amount, the productivity, and the like.

The thus obtained coating film containing the polyhydroxyimide can produce a positive pattern.

After the formation of the coating film, by exposing the coating film to, for example, an ultraviolet ray using a mask having a predetermined pattern and by developing the coating film with an alkali developer, an exposed part is washed-removed, so that a relief pattern having a sharp edge face is formed on a substrate.

The alkali developer used here is not particularly limited so long as the alkali developer is an alkaline aqueous solution and examples thereof include: an aqueous solution of an alkali metal hydroxide such as potassium hydroxide, sodium hydroxide, potassium carbonate, and sodium carbonate; an aqueous solution of a quaternary ammonium hydroxide such as tetramethylammonium hydroxide, tetraethylammonium hydroxide, and choline; and an aqueous solution of an amine such as ethanolamine, propylamine, and ethylenediamine.

The concentration of the alkali developer is generally 10% by mass or less, and industrially, a 0.1 to 3.0% by mass alkaline aqueous solution is used. The alkali developer can also contain alcohols, a surfactant, and the like and the content of each is desirably about 0.05 to 10% by mass.

In the developing process, although the temperature of the alkali developer can be optionally selected, when the positive photosensitive resin composition of the present invention is used, the solubility of an exposed part is high, so that development with the alkali developer can be easily performed at room temperature.

By subjecting the substrate having the thus obtained relief pattern to thermal treatment (baking) at a temperature of 180° C. to 400° C., a cured film having a relief pattern and having low water absorbency, accordingly having excellent electric properties, and having advantageous heat resistance and advantageous chemicals resistance, can be obtained.

The production method of a polyhydroxyimide can also be applied to a production method of a hydroxyimide. That is, in the production method of a polyhydroxyimide, by using a hydroxyamic acid instead of the polyhydroxyamic acid and the same solvent and by the same operation at the same temperature as in the above production method, a hydroxyimide can be obtained. In the method for obtaining a polyamic acid, by using a dicarboxylic acid component and an amine or diamine component instead of the tetracarboxylic acid component and the diamine component, and the same solvent and by the same operation at the same temperature as in the above method, an amic acid can be obtained.

Hereinafter, the production method of a hydroxyimide will be described.

<Hydroxyimide Precursor>

The hydroxyimide precursor used in the present invention is a compound of Formula (8):

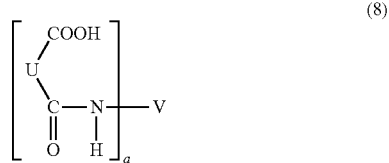

(where
U is a divalent aliphatic group or aromatic group,
V is an organic group containing an aromatic group substituted with at least one OH group, and
a is an integer of 1 or 2).

In Formula (8), V is preferably an organic group containing a benzene ring substituted with at least one OH group.

Examples of V include groups having a structure of Formula (10) or Formula (11):

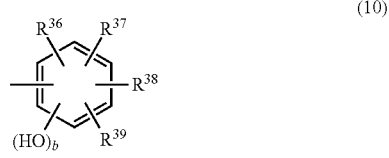

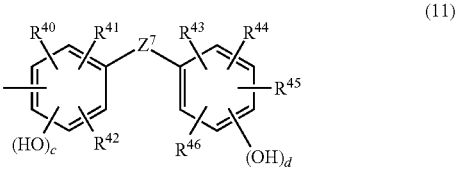

(where
$R^{36}$ to $R^{38}$ and $R^{40}$ to $R^{45}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W, $R^{39}$ to $R^{46}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W, W is the same as defined above, $Z^7$ is the same as $Z^1$, and b to d are an integer of 1 or more and satisfy the equations: $2 \geq b \geq 1$, and $2 \geq c+d \geq 1$).

In Formula (11), $Z^7$ is preferably a single bond, $-CH_2-$, $-C(CH_3)_2-$, $-C(CF_3)_2-$, $-C(O)NH-$, $-O-$, $-S(O)_2-$, or $-C(O)-$.

V is particularly preferably a group having an OH group at an o-position relative to an adjacent —NH group among Formulae (10) and (11).

The hydroxyimide precursor (hydroxyamic acid) of Formula (8) that is used in the present invention can be obtained, for example, by reacting a dicarboxylic acid component with an amine or diamine component.

Here, although the dicarboxylic acid component and the amine or diamine component used in the present invention are not particularly limited, from the viewpoint of the solubility of the obtained hydroxyimide precursor in an organic solvent or the like, at least any one of the dicarboxylic acid component and the amine or diamine component contains preferably a component having a fluorine-having organic group in at least a part thereof. Although the fluorine-having organic group in the dicarboxylic acid component or the amine or diamine component is not particularly limited, the organic group is preferably a fluoro group, a fluoroalkyl group, or the like that is directly bonded to a benzene ring. Particularly, from the viewpoint of the solubility in a solvent or the like, a dicarboxylic acid component or an amine or diamine component having a trifluoromethyl group or a hexafluoroisopropylidene group is preferred. To these organic groups, one fluorine atom or a plurality of fluorine atoms is(are) optionally bonded.

[Dicarboxylic Acid Component]

The dicarboxylic acid component capable of constituting the hydroxyimide precursor (hydroxyamic acid) of Formula (8) that is used for the production method of the present invention is not particularly limited so long as the dicarboxylic acid component is a dicarboxylic acid, an acid anhydride of the dicarboxylic acid, or a compound derived from the dicarboxylic acid or the acid anhydride. Specific examples thereof are mentioned as follows.

Specific examples of the dicarboxylic acid component include such compounds as succinic acid, phthalic acid, maleic acid, cyclohexanedicarboxylic acid, 1,2,3,6-tetrahydrophthalic acid, cyclopropane-1,2-dicarboxylic acid, and cyclobutane-1,2-dicarboxylic acid, acid anhydrides of the dicarboxylic acids, and derivatives of the dicarboxylic acids or the acid anhydrides, to which the specific examples are not limited.

As the dicarboxylic acid component, one type or two or more types of compound(s) among the above dicarboxylic acids, acid anhydrides of the dicarboxylic acids, and derivatives of the dicarboxylic acids or the acid anhydrides can be combined to be used.

[Amine Component]

The amine component constituting the hydroxyimide precursor (hydroxyamic acid) of Formula (8) that is used for the production method of the present invention is an amine containing an aromatic group substituted with at least one OH group.

The amine containing an aromatic group substituted with at least one OH group is not particularly limited and examples thereof include amines such as 2-aminophenol, 2-amino-4-methylphenol, 2-amino-5-methylphenol, 2-amino-6-methylphenol, and 2-amino-4-phenylphenol, to which the examples are not limited.

[Diamine Component]

The diamine component constituting the hydroxyimide precursor (hydroxyamic acid) of Formula (8) that is used for the production method of the present invention is a diamine containing an aromatic group substituted with at least one OH group.

The diamine containing an aromatic group substituted with at least one OH group is not particularly limited and examples thereof include 2,6-diaminophenol and diamine components same as the diamine components constituting the polyhydroxyimide precursor (hydroxyamic acid).

[Production Method of Hydroxyimide Precursor]

The hydroxyimide precursor (hydroxyamic acid) used for the production method of the present invention can be obtained by subjecting the dicarboxylic acid component and the amine or diamine component (an amine or diamine containing an aromatic group substituted with at least one OH group) and, if desired, another amine or diamine component to a reaction in an organic solvent.

The organic solvent and the reaction temperature that are used in the synthesis reaction are the same as the solvent and the reaction temperature that are used in the above production method of the polyhydroxyimide precursor.

The thus obtained solution containing the hydroxyimide precursor as it is can be used in the preparation of a hydroxyimide described below. The hydroxyimide precursor can be precipitation-isolated in a poor solvent such as water, methanol, and ethanol to be recovered to be used.

<Production Method of Hydroxyimide>

The production method of the hydroxyimide of the present invention is in detail a method for obtaining a hydroxyimide of Formula (9) by heating the hydroxyimide precursor of Formula (8) at a temperature of 50° C. or more in the compound of Formula (2) or Formula (3) or both compounds of Formula (2) and Formula (3) (ester solvent) to react the hydroxyimide precursor.

The heating temperature, the reaction time, the operations for producing the hydroxyimide precursor, and the operations for recovering and purifying the generated hydroxyimide are the same as in the above production method of a polyhydroxyimide.

EXAMPLES

Hereinafter, the present invention will be described more in detail referring to Examples which should not be construed as limiting the scope of the present invention.

<Abbreviation Used in Examples>

The meanings of the abbreviations used in Examples below are as follows.

[Acid Anhydride]
DSDA: 3,3'-4,4'-diphenylsulfonetetracarboxylic dianhydride
CYC1: manufactured by Iwatani Industrial Gases Corp., PMDA-HH (trade name), (compound name: cyclohexanetetracarboxylic anhydride)
CYC2: manufactured by Iwatani Industrial Gases Corp., PMDA-Hs (trade name), (compound name: cyclohexanetetracarboxylic anhydride)
PA: phthalic anhydride
1,2-CyHxA: cyclohexanedicarboxylic anhydride
1,2,3,6-TPA: 1,2,3,6-tetrahydrophthalic anhydride
[Amines]
BAHF: 2,2'-bis(3-amino-4-hydroxyphenyl)hexafluoropropane
BAPF: bis(3-amino-4-hydroxyphenyl)methane
AHPE: 3,3'-diamino-4,4'-dihydroxy-phenyl ether
BAPA: 2,2'-bis(3-amino-4-hydroxyphenyl)propane
BSDA: bis(3-amino-4-hydroxyphenyl)sulfone
3-BP: 4,4'-diamino-3,3'-dihydroxybiphenyl
BABHBPA: bis-N,N'-(p-aminobenzoyl)-hexafluoro-2,2'-bis(4-hydroxyphenyl)propane
APDS: bis(3-aminopropyl)-1,1,3,3-tetramethyldisiloxane
[Solvent]
NMP: N-methyl-2-pyrrolidone
HBM: methyl 2-hydroxyisobutyrate
HBE: ethyl 2-hydroxyisobutyrate
MAM: methyl methoxyacetate
4PhHBM: methyl 2-(4-chlorophenoxy)isobutyrate
GlyME: methyl glycolate
EL: ethyl lactate
GBL: γ-butyrolactone
PGMEA: propylene glycol monomethyl ether acetate
[Photoacid Generator]
P200: manufactured by Toyo Gosei Co., Ltd.; P-200 (trade name) (photosensitizer synthesized by subjecting 1 mol of 4,4'-[1-[4-[1-(4-hydroxyphenyl)-1methylethyl]phenyl]ethylidene]bisphenol and 2 mol of 1,2-naphthoquinone-2-diazide-5-sulfonyl chloride to a condensation reaction)
[Crosslinker]
BMI-80: manufactured by K.I Chemical Industry Co., Ltd.; BMI-80 (trade name); (compound name: 2,2'-bis[4-(4-maleimidephenoxy)phenyl]propane) NCO1: manufactured by Degussa AG; VESTAGON (registered trade mark) B 1065 (trade name)
EPO1: manufactured by Daicel Chemical Industries; Celloxide 201P (trade name)
[Developer]
NMD: tetramethylammonium hydroxide aqueous solution <Measurement of Number Average Molecular Weight and Weight Average Molecular Weight>

The weight average molecular weight (hereinafter, abbreviated as Mw) and the molecular weight distribution of the polymer were measured using a GPC apparatus (Shodex (registered trade mark) column KF803L and KF805L) manufactured by JASCO Corporation under the condition that dimethylformamide was used as the elution solvent; the flow rate was 1 mL/min; and the column temperature was 50° C. Here, Mw was measured in terms of polystyrene.

<Measurement of Imidation Rate>

The imidation rate was calculated by measuring H-NMR (JNM-LA series; manufactured by JEOL Ltd.) and from the proton ratio of an aromatic moiety in a polymer skeleton, the proton ratio of a NH moiety in a polyamic acid or an amic acid, and the proton ratio of a hydroxy group. As the deuterated solvent, dimethylsulfoxide was used. The cumulated number was set at 64 times and the imidation rate was measured twice to calculate the average value.

Example 1

Synthesis of Polyhydroxyimide

To 240 g of HBM in which 30.3 g (0.083 mol) of BAHF was dissolved, 29.7 g (0.083 mol) of DSDA was added and the resultant reaction mixture was subjected to the reaction at room temperature for 48 hours to synthesize a polyamic acid solution. The solution was heated at 90° C. for 24 hours. Then, the solution was precipitated in 2,000 g of methylene chloride to obtain a polymer and the obtained polymer was filtered and then dried in a vacuum oven (60° C., for 18 hours).

The yield of the obtained polymer was 58.8 g (yield rate: 98.0%). The imidation rate at this time was 98% and the weight average molecular weight was 27,000. From the H-NMR, a hydroxy group was confirmed.

Example 2 to Example 19

Synthesis of Polyhydroxyimide

In the same manner as in Example 1, a polyamic acid was synthesized and the polyamic acid was heated at the temperature and for the time that are shown in Table 1 to synthesize a polyhydroxyimide and to recover the polyhydroxyimide in the same procedure as in Example 1.

The types and the added amounts of the used acid dianhydride, amine, and solvent, the heating temperature and the heating time, and the measurement results of the yield rate, the molecular weight, and the imidation rate of the obtained polyhydroxyimide, are shown in Table 1.

tated in 2,000 g of methylene chloride to obtain a polymer and the obtained polymer was filtered and then dried in a vacuum oven (40° C., for 18 hours).

The yield of the obtained polymer was 58.8 g (yield rate: 98.0%).

The imidation rate at this time was 93% and the weight average molecular weight was 8,000. From the H-NMR, a hydroxy group was confirmed.

Comparative Synthesis Example 1

To 70 g of NMP in which 9.31 g (0.025 mol) of BAHF and 0.702 g (0.003 mol) of APDS were dissolved, 4.98 g (0.025 mol) of CBDA was added and the resultant reaction mixture was subjected to the reaction at room temperature for 24 hours to synthesize a polyhydroxyamic acid solution. The solution was heated at 80° C. for 20 hours. Then, the solution was precipitated in 200 g of a 50% by weight methanol aqueous solution to obtain a polymer and the obtained polymer was filtered and then dried in a vacuum oven (60° C., for 18 hours).

The imidation rate was measured and found to be 3%.

Comparative Synthesis Example 2

To 70 g of NMP in which 14.6 g (0.040 mol) of BAHF and 1.10 g (0.004 mol) of APDS were dissolved, 14.2 g (0.040

TABLE 1

Polymer formulations, synthesis conditions, and properties of the obtained polymers

| | Anhydride | | Amine | | Solvent | | Heating condition | | | | |
|---|---|---|---|---|---|---|---|---|---|---|---|
| | 1 Added | 2 Added | 1 Added | 2 Added | Solvent 1 Added | Solvent 2 Added | | | Yield | Molecular | Imidation |
| Example | amount (g) | amount (g) | amount (g) | amount (g) | amount (g) | amount (g) | Temp. (° C.) | Time (h) | rate (%) | weight (Mw) | rate (%) |
| 1 | DSDA/29.7 | — | BAHF/30.3 | — | HBM/240 | — | 90 | 24 | 98.0 | 27,000 | 98 |
| 2 | DSDA/29.7 | — | BAHF/30.3 | — | HBM/240 | — | 70 | 38 | 96.3 | 25,000 | 95 |
| 3 | DSDA/29.7 | — | BAHF/30.3 | — | GBL/240 | — | 120 | 24 | 96 | 16,000 | 99 |
| 4 | CYC1/8.20 | — | BAHF/11.0 | APDS/0.82 | HBM/80 | GBL/160 | 90 | 24 | 97.5 | 10,000 | 97 |
| 5 | CYC2/8.20 | — | BAHF/11.0 | APDS/0.82 | HBM/80 | GBL/160 | 90 | 24 | 97.5 | 76,800 | 95 |
| 6 | DSDA/29.7 | — | BAHF/30.3 | — | HBM/80 | GBL/160 | 80 | 24 | 97.5 | 22,500 | 95 |
| 7 | DSDA/29.7 | — | BAHF/30.3 | — | EL/160 | GBL/80 | 80 | 24 | 93.0 | 7,700 | 90 |
| 8 | DSDA/5.56 | — | BAHF/5.69 | — | HBE/30 | GBL/15 | 90 | 24 | 98.0 | 22,000 | 95 |
| 9 | DSDA/5.56 | — | BAHF/5.69 | — | MAM/30 | GBL/15 | 90 | 24 | 98.3 | 16,800 | 95 |
| 10 | DSDA/5.56 | — | BAHF/5.69 | — | GlyME/30 | GBL/15 | 90 | 24 | 95.0 | 6,000 | 90 |
| 11 | DSDA/14.8 | — | BAHF/15.2 | — | 4PhHBM/80 | GBL/80 | 90 | 24 | 98.0 | 19,400 | 95 |
| 12 | DSDA/3.36 | — | BSDA/2.63 | — | HBM/22.7 | GBL/11.33 | 90 | 24 | 97.5 | 12,200 | 95 |
| 13 | DSDA/3.64 | — | AHPE/2.36 | — | HBM/22.7 | GBL/11.33 | 90 | 24 | 95.0 | 24,600 | 93 |
| 14 | DSDA/3.65 | — | BAPF/2.35 | — | HBM/22.7 | GBL/11.33 | 90 | 24 | 93.0 | 6,000 | 93 |
| 15 | DSDA/3.49 | — | BAPA/2.51 | — | HBM/22.7 | GBL/11.33 | 90 | 24 | 98.0 | 27,700 | 95 |
| 16 | DSDA/3.74 | — | 3-BP/2.26 | — | HBM/22.7 | GBL/11.33 | 90 | 24 | 98.9 | 25,100 | 93 |
| 17 | DSDA/29.7 | — | BAHF/30.3 | — | PGMEA/240 | — | 90 | 24 | 97.0 | 12,000 | 90 |
| 18 | DSDA/2.23 | — | BABH BPA/3.76 | — | HBM/22.7 | GBL/11.33 | 90 | 24 | 99.0 | 31,700 | 90 |
| 19 | DSDA/14.8 | TMA/2.8 | BAHF/16.0 | APDS/1.2 | HBM/32.5 | PGMEA/32.5 | 90 | 24 | 98.0 | 6,000 | 95 |

Example 20

Synthesis of Polyhydroxyimide 240 g of HBM in which 30.3 g (0.083 mol) of BAHF was dissolved was heated to 50° C., and thereto, 29.7 g (0.083 mol) of DSDA was added. Then, the resultant solution was heated at 50° C. for 24 hours. Then, the solution was precipimol) of DSDA was added and the resultant reaction mixture was subjected to the reaction at room temperature for 24 hours to synthesize a polyhydroxyamic acid solution. To the solution, 200 g of NMP was added, and further, 45.2 g (0.440 mol) of acetic anhydride and 21.0 g (0.254 mol) of pyridine were added to heat the resultant reaction mixture at 40° C. for 4 hours. Then, the resultant reaction mixture was precipitated in 2,100 g of a 50% by weight methanol aqueous solution to obtain a polymer and the obtained polymer was filtered and then dried in a vacuum oven (40° C., for 18 hours).

As the result of NMR measurement, although the imidation rate was 92%, hydroxy groups were entirely acetoxylated.

Comparative Synthesis Example 3

To 24 g of HBM in which 3.03 g (0.008 mol) of BAHF was dissolved, 2.97 g (0.008 mol) of DSDA was added and the resultant reaction mixture was subjected to the reaction at room temperature for 48 hours to synthesize a polyhydroxyamic acid solution. The solution was heated at 40° C. for 24 hours. Then, the solution was precipitated in 2,000 g of methylene chloride to obtain a polymer and the obtained polymer was filtered and then dried in a vacuum oven (60° C., for 18 hours).

As the result of imidation rate measurement, the imidation rate was 2%.

As described above, in Example 1 to Example 20, under a moderate production condition such as a neutral condition using an ester solvent, a polyhydroxyimide having a high imidation rate such as 90% or more could be synthesized.

On the other hand, in Comparative Synthesis Example 1 using no ester solvent and Comparative Synthesis Example 3 in which the imidation was performed under a condition of a temperature (40° C.) lower than in Examples, the imidation was hardly performed. Further, in Comparative Synthesis Example 2 using a conventional imidation method using acetic anhydride and a basic solvent, although the imidation rate was high, it resulted in that a hydroxy group was acetoxylated.

Example 21 to Example 29

Photosensitive Properties Evaluation

<Preparation of Positive Photosensitive Resin Composition (Varnish)>

The polymer solution prepared using the above-obtained polymer powder, a crosslinker, a photosensitizer, and 0.0002 g of a fluorinated surfactant (manufactured by DIC Corporation (formerly, Dainippon Ink & Chemicals Inc.); MEGAFAC R-30 (trade name)) were blended and the resultant reaction mixture was stirred at room temperature for 3 hours or longer to prepare a positive photosensitive resin composition (varnish). With respect to Comparative Example 2, a polymer powder subjected to precipitation-purification was used.

The formulation of each prepared positive photosensitive resin composition (varnish) is shown in Table 2.

TABLE 2

Formulation of positive photosensitive resin composition (varnish)

| | | Polymer solution | | Photosensitizer P200 (g) | Crosslinker | | Solvent Type/amount (g) |
|---|---|---|---|---|---|---|---|
| | | Type | Used amount (g) | | Type/used amount (g) | Type/used amount (g) | |
| Example | | | | | | | |
| | 21 | Example 2 | 3.0 g | 0.4 g | | | HBM/6.0 g, GBL/3.0 g |
| | 22 | Example 12 | 3.0 g | 0.2 g | | | HBM/2.0 g, GBL/1.0 g |
| | 23 | Example 13 | 3.0 g | 0.2 g | | | HBM/2.0 g, GBL/1.0 g |
| | 24 | Example 15 | 3.0 g | 0.2 g | | | HBM/2.0 g, GBL/1.0 g |
| | 25 | Example 16 | 3.0 g | 0.2 g | | | HBM/2.0 g, GBL/1.0 g |
| | 26 | Example 18 | 3.0 g | 0.2 g | | | HBM/2.0 g, GBL/1.0 g |
| | 27 | Example 19 | 6.0 g | 1.1 g | BMI-80/0.8 g | | HBM/2.0 g, PGMEA/0.2 g, GBL/2.1 g |
| | 28 | Example 19 | 6.0 g | 0.9 g | NCO1/0.5 g | EPO1/0.2 g | HBM/1.4 g, GBL/0.3 g |
| | 29 | Example 20 | 6.0 g | 1.1 g | BMI-80/0.8 g | | HBM/0.2 g, PGMEA/0.2 g GBL/1.2 g |
| Comparative Example | | | | | | | |
| | 1 | Comparative Synthesis Example 1 | 5.0 g | 0.5 g | | | NMP: 2.2 g |
| | 2 | Comparative Synthesis Example 2 (Remark 1) | 1.0 g | 0.6 g | | | PGME: 7.1 g |
| | 3 | Comparative Synthesis Example 3 | 3.0 g | 0.3 g | | | HBM: 3.2 g |

(Remark 1): Polymer powder subjected to precipitation-purification was used.

<Photosensitive Properties Evaluation>

With respect to the coating film formed from the positive photosensitive resin composition obtained in Table 2, the coating film thickness, the film thickness after development, the line width, and the developability were evaluated by the methods below. The evaluation results are shown in Table 3.

[Coating Film Thickness]

Each positive photosensitive resin composition was applied on an ITO substrate (manufactured by Sanyo Vacuum Industries Co., Ltd.) having a bump of 25 mm×25 mm by a spin coater and the resultant coating was pre-baked on a hot plate at a temperature of 110° C. for 120 seconds to form a coating film. The film thickness was measured using a contacting film thickness measuring instrument (manufactured by ULVAC, Inc.; Dektak 3ST).

[Film Thickness after Development]

The obtained coating film was irradiated with an ultraviolet light by an ultraviolet irradiating apparatus (manufactured by Canon; PLA-501) through a mask of line/space. After exposure, the coating film was immersed in an NMD developer of 23° C. to be developed to measure the film thickness after development.

[Line Width]

The coating film after development was observed under an optical microscope to confirm the minimum line width with which an objective pattern of the line/space mask was formed.

[Developability]

The developability of each of Examples and Comparative Examples was evaluated as follows.
A: Pattern preparation was possible with a 2.4% by weight NMD developer and the change in the film thickness after development was small.
B: Although pattern preparation was possible with a 2.4% by weight NMD developer, the change in the film thickness after development was large.
C: Pattern preparation was possible with a 0.4% by weight NMD developer.
D: Pattern preparation was not possible at all, Any of the coating films formed from the positive photosensitive resin compositions (varnishes) of Example 21 to Example 29 could obtain a positive pattern. However, the coating films formed from the positive photosensitive resin compositions (varnishes) of Comparative Example 1 to Comparative Example 3 could not be developed or were dissolved.

Example 30

Synthesis of Hydroxyimide

To 28.0 g of GBL in which 3.19 g (0.029 mol) of 2-AF was dissolved, 4.30 g (0.029 mol) of PA was added and the resultant reaction mixture was subjected to the reaction at room temperature for 2 hours to synthesize an amic acid solution. To the solution, 14.0 g of HBM was added and the resultant reaction mixture was heated at 80° C. for 24 hours. The reaction solution was measured by NMR, and as the result, it was found that the imidation was quantitatively performed. Next, the obtained solution was charged into 500 g of methylene chloride and the resultant deposit was filtered and then dried under reduced pressure to obtain an imide compound.

The yield of the obtained imide compound was 7.38 g (yield rate: 99%).

Example 31 to Example 34

Synthesis of Hydroxyimide

Using the acid anhydride, the amine compound, and the solvent that are shown in Table 4 and in the same manner as in Example 30, an amic acid was synthesized and the amic acid was heated at the temperature and for the time that are shown in Table 4 to synthesize a hydroxyimide and to recover the hydroxyimide in the same procedure as in Example 30.

The types and the added amounts of the used acid anhydride, amine, and solvent, the heating temperature and the

TABLE 3

Result of photosensitive properties evaluation

| | Coating film thickness (μm) | Irradiation dose (mJ/cm$^2$) | NMD developer concentration (%) | Developing time (sec) | Film thickness after development (μm) | Film loss amount (μm) | Line width (μm) | Developability |
|---|---|---|---|---|---|---|---|---|
| Example | | | | | | | | |
| 21 | 2.0 | 50 | 2.4 | 30 | 1.8 | 0.2 | 8 | A |
| 22 | 0.8 | 50 | 0.4 | 30 | 0.6 | 0.2 | 10 | C |
| 23 | 1.0 | 50 | 0.4 | 30 | 0.9 | 0.1 | 10 | C |
| 24 | 1.1 | 50 | 2.4 | 30 | 0.7 | 0.4 | 10 | B |
| 25 | 1.1 | 50 | 0.4 | 30 | 0.9 | 0.2 | 10 | C |
| 26 | 1.4 | 50 | 2.4 | 30 | 0.7 | 0.7 | 8 | B |
| 27 | 1.4 | 50 | 2.4 | 45 | 1.2 | 0.2 | 6 | A |
| 28 | 4.8 | 300 | 2.4 | 70 | 4.7 | 0.1 | 6 | A |
| 29 | 1.3 | 50 | 2.4 | 30 | 1.1 | 0.2 | 6 | A |
| Comparative Example | | | | | | | | |
| 1 | 2.0 | 100 | 2.4 | 30 | 0 | 2.0 | — | D |
| 2 | 3.0 | 100 | 2.4 | 30 | 3.0 | 0.0 | — | D |
| 3 | 1.0 | 100 | 0.4 | 30 | 0 | 1.0 | — | D | heating time, and the measurement result of the yield rate of the obtained hydroxyimide, are shown in Table 4.

strength, and electric properties that are characteristics of an imide-based resin, but also in sensitivity and resolution that

TABLE 4

Formulations, synthesis conditions, and yields of the obtained imides

| | Formulation | | Used solvent | | Heating condition | | Yield |
|---|---|---|---|---|---|---|---|
| | Anhydride | (Di) amine | Solvent 1 | Solvent 2 | | | |
| Example | Added amount (g) | Added amount (g) | Added amount (g) | Added amount (g) | Temp. (° C.) | Time (h) | rate (%) |
| 30 | PA/4.30 | 2-AF/3.19 | HBM 14.0 | GBL 28.0 | 80 | 24 | 99.0 |
| 31 | PA/4.30 | 2-AF/3.20 | HBM 21.5 | GBL 21.5 | 90 | 16 | 99.0 |
| 32 | 1,2-CyHxA/4.38 | 2-AF/3.12 | HBM 42.5 | — | 80 | 24 | 98.0 |
| 33 | 1,2,3,6--TPA/ 4.30 | BAHF/5.29 | HBM 21.5 | GBL 21.5 | 110 | 24 | 97.5 |
| 34 | 1,2,3,6-- TPA/4.35 | 2-AF/3.18 | HBM 21.5 | GBL 21.5 | 110 | 24 | 97.0 |

Comparative Synthesis Example 4

To 42 g of NMP in which 3.19 g (0.029 mol) of 2-AF was dissolved, 4.30 g (0.029 mol) of PA was added and the resultant reaction mixture was subjected to the reaction at room temperature for 2 hours to synthesize an amic acid solution. The solution was heated at 80° C. for 24 hours. The reaction solution was measured by NMR, and as the result, the imidation rate was 75%.

Comparative Synthesis Example 5

To 28 g of GBL in which 2.82 g (0.031 mol) of aniline was dissolved, 4.60 g (0.031 mol) of PA was added and the resultant reaction mixture was subjected to the reaction at room temperature for 2 hours to synthesize an amic acid solution. To the solution, 12 g of HBM was added and the resultant reaction mixture was heated at 80° C. for 24 hours. The reaction solution was measured by NMR, and as the result, the imidation rate was 80%.

As described above, in Example 30 to Example 34, under a moderate production condition such as a neutral condition using an ester solvent, a quantitatively imidated hydroxyimide could be synthesized.

On the other hand, Comparative Synthesis Example 4 using no ester solvent and Comparative Synthesis Example 5 using an amine having no hydroxy group exhibited a low imidation rate in comparison with Example 30 to Example 34.

INDUSTRIAL APPLICABILITY

As described above, the present invention is characterized by improving problems in conventional production of a polyhydroxyimide requiring a high-temperature heating process and a cumbersome production process.

According to the production method of a polyhydroxyimide of the present invention, by using a specific ester solvent, a polyhydroxyimide can be produced without converting a hydroxy group into an acetoxy group.

That is, for example, without inactivating a developing group (hydroxy group) necessary for utilizing as a photosensitive resin, a polyhydroxyimide can be produced under a neutral condition.

Accordingly, the polyhydroxyimide obtained according to the present invention can produce a cured film excellent not only in electric insulation, heat resistance, mechanical strength, and electric properties that are characteristics of an imide-based resin, but also in sensitivity and resolution that are important for a photosensitive resin composition. That is, the polyhydroxyimide can be applied to the production of a cured film capable of forming a high resolution circuit pattern.

Further, the polyhydroxyimide of the present invention is suitable for a material for forming a cured film such as a protective film, a planarization film, and an insulation film in various displays such as a thin film transistor (TFT)-type liquid crystal display element and an organic EL element, and particularly is suitable also for a material for forming an interlayer insulation film for a TFT-type liquid crystal element, a color filter, an array planarization film, a concavoconvex film under a reflection film of a reflection-type display, an insulation film for an organic EL element, and the like.

In addition, as described above, by the production method of the present invention, a polyhydroxyimide can be produced from a polyhydroxyamic acid by a one-step process, so that there can be expected the achievement of simplification of the production process and the cost reduction in comparison with a conventional method. Therefore, the production method of the present invention is applicable as an excellent industrial production method.

The invention claimed is:

1. A production method of a polyhydroxyimide, comprising: adding to a polyhydroxyimide precursor containing a repeating structure of Formula (1):

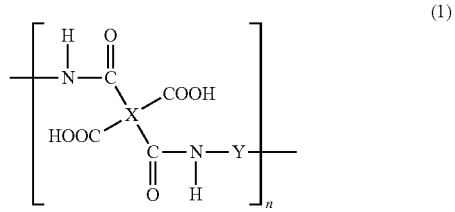

(where
X is a tetravalent aliphatic group or aromatic group,
Y is an organic group containing an aromatic group substituted with at least one OH group,
and
n is an integer of 1 or more),
at least a compound of Formula (2) or Formula (3):

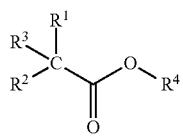
(2)

(where
- $R^1$ to $R^3$ are independently a hydrogen atom, a $C_{1-10}$ alkyl group optionally interrupted with an oxygen atom, a $C_{1-10}$ haloalkyl group, a $C_{1-10}$ alkoxy group, an aryloxy group optionally substituted with W, a halogen atom, a nitro group, a cyano group, a hydroxy group, a phenyl group optionally substituted with W, a naphthyl group optionally substituted with W, a thienyl group optionally substituted with W, or a furyl group optionally substituted with W,
- $R^4$ is a hydrogen atom, a $C_{1-10}$ alkyl group, a $C_{1-10}$ haloalkyl group, a phenyl group optionally substituted with W, a naphthyl group optionally substituted with W, a thienyl group optionally substituted with W, or a furyl group optionally substituted with W, and
- W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group, or a sulfo group)

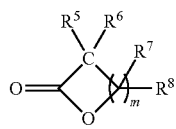
(3)

(where
- m is a natural number,
- $R^5$ to $R^8$ are independently a hydrogen atom, a $C_{1-10}$ alkyl group, a $C_{1-10}$ haloalkyl group, a $C_{1-10}$ alkoxy group, a halogen atom, a nitro group, a cyano group, a hydroxy group, a phenyl group optionally substituted with W, a naphthyl group optionally substituted with W, a thienyl group optionally substituted with W, or a furyl group optionally substituted with W, and
- W is a $C_{1-10}$ alkyl group, a $C_{1-40}$ haloalkyl group, a $C_{1-10}$ alkoxy group, a hydroxy group, a halogen atom, a nitro group, a formyl group, a cyano group, a carboxy group, a phospho group, or a sulfa group)

or both compounds of Formula (2) and Formula (3) and heating the resultant reaction mixture at a temperature of 50° C. or more to obtain a polyimide containing a repeating structure of Formula (4):

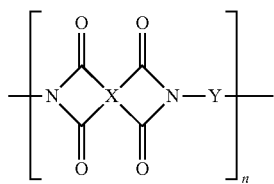
(4)

(where X, Y, and n are the same as defined above)
and having a weight average molecular weight measured by gel permeation chromatography (GPC) in terms of polystyrene of 5,000 to 100,000.

2. The production method of a polyhydroxyimide according to claim 1, wherein Y is an organic group containing a benzene ring substituted with at least one OH group.

3. The production method of a polyhydroxyimide according to claim 2, wherein Y contains at least one type of structure selected from the structures of Formula (5) to Formula (7):

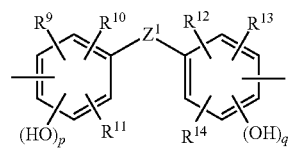
(5)

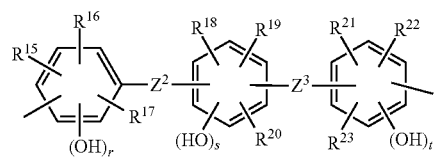
(6)

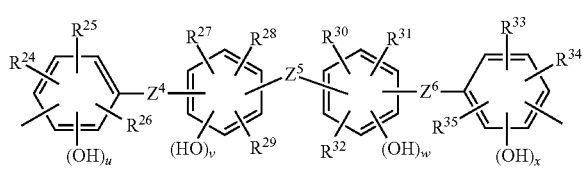
(7)

(where
- $R^9$ to $R^{35}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W,
- W is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxy group, a phospho group, or a sulfo group,
- $Z^1$ to $Z^6$ are a single bond, a $C_{1-10}$ alkylene group optionally substituted with $W^1$, —C(O)O—, —C(O)NH—, —O—, —S—, —S(O)$_2$—, or —C(O)—,
- $W^1$ is a $C_{1-10}$ alkyl group, a $C_{1-10}$ haloalkyl group, or a $C_{1-10}$ alkoxy group, and
- p to x are an integer of 1 or more and satisfy the equations: $2 \geq q \geq 1$; $2 \geq r+s+t \geq 1$; and $2 \geq u+v+w+x \geq 1$).

4. The production method of a polyhydroxyimide according to claim 3, wherein $Z^1$ to $Z^6$ are a single bond, —CH$_2$—, —C(CH$_3$)$_2$—, —C(CF$_3$)$_2$—, —C(O)NH—, —O—, —S(O)$_2$—, or —C(O)—.

5. The production method of a polyhydroxyimide according to claim 1, wherein in Formula (2), $R^4$ is a methyl group or an ethyl group.

6. The production method of a polyhydroxyimide according to claim 1, wherein in Formula (2), $R^1$ and $R^2$ are a methyl group.

7. The production method of a polyhydroxyimide according to claim 1, wherein in Formula (2), any one of $R^1$ to $R^3$ is a hydroxy group, an alkoxy group, or a phenyl group, a naphthyl group, a thienyl group, or a furyl group each of which has a hydroxy group.

8. The production method of a polyhydroxyimide according to claim 1, wherein the compound of Formula (2) is a compound having a boiling point of 70° C. or more and less than 200° C.

9. The production method of a polyhydroxyimide according to claim 1, wherein the compound of Formula (3) is γ-butyrolactone.

10. The production method of a polyhydroxyimide according to claim 1, wherein the compound of Formula (2) or Formula (3) or both compounds of Formula (2) and Formula (3) is(are) added in an amount of 50 parts by mass or more relative to 100 parts by mass of the polyhydroxyimide precursor containing a repeating structure of Formula (1).

11. The production method of a polyhydroxyimide according to claim 1, wherein the heating temperature is 50° C. to 120° C.

12. A polyhydroxyimide produced by the method of claim 1.

13. A varnish comprising the polyhydroxyimide as claimed in claim 12.

14. A coating film comprising the varnish as claimed in claim 13.

15. A positive photosensitive resin composition comprising:
the polyhydroxyimide as claimed in claims 12; and
0.01 to 100 parts by mass of a photoacid generator relative to 100 parts by mass of the polyhydroxyimide.

16. The positive photosensitive resin composition according to claim 15, further comprising 200 parts by mass or less of a crosslinker relative to 100 parts by mass of the polyhydroxyimide.

17. A production method of a hydroxyimide, comprising:
adding to a hydroxyimide precursor of Formula (8):

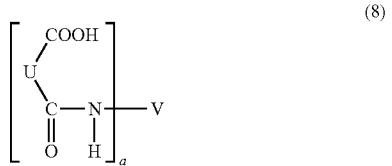

(where
U is a divalent aliphatic group or aromatic group,
V is an organic group containing an aromatic group substituted with at least one OH group,
and
a is an integer of 1 or 2), at least the compound of Formula (2) or Formula (3) according to claim 1 or both compounds of Formula (2) and Formula (3) and heating the resultant reaction mixture at a temperature of 50° C. or more to obtain an imide of Formula (9):

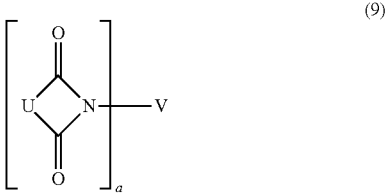

(where U, V, and a are the same as defined above).

18. The production method of a hydroxyimide according to claim 17, wherein V is an organic group containing a benzene ring substituted with at least one OH group.

19. The production method of a hydroxyimide according to claim 18, wherein V contains at least one type of structure selected from the structures of Formula (10) and Formula (11):

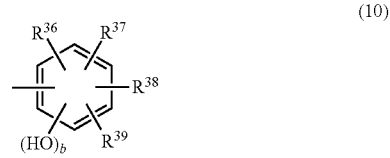

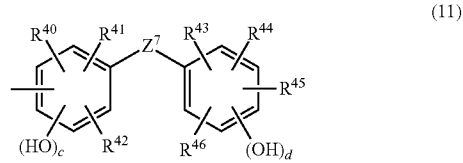

(where
$R^{36}$ to $R^{38}$ and $R^{40}$ to $R^{45}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W,
$R^{39}$ to $R^{46}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, a carboxy group, a phospho group, a sulfo group, a phenyl group optionally substituted with W, a naphthyl group optionally substituted with W, a thienyl group optionally substituted with W, or a furyl group optionally substituted with W,
W is the same as defined above,
$Z^7$ is the same as $Z^1$, and
b to d are an integer of 1 or more and satisfy the equations:
$2 \geq b \geq 1$ and $2 \geq c+d \geq 1$).

20. The production method of a hydroxyimide according to claim 19, wherein $Z^7$ is a single bond, —CH$_2$—, —C(CH$_3$)$_2$—, —C(CF$_3$)$_2$—, —C(O)NH—, —O—, —S(O)$_2$—, or —C(O)—.

21. The production method of a hydroxyimide according to claim 17, wherein in Formula (2), $R^4$ is a methyl group or an ethyl group.

22. The production method of a hydroxyimide according to claim 17, wherein in Formula (2), $R^1$ and $R^2$ are a methyl group.

23. The production method of a hydroxyimide according to claim 17, wherein in Formula (2), any one of $R^1$ to $R^3$ is a hydroxy group, an alkoxy group, or a phenyl group, a naphthyl group, a thienyl group, or a furyl group each of which has a hydroxy group.

24. The production method of a hydroxyimide according to claim 17, wherein the compound of Formula (2) is a compound having a boiling point of 70° C. or more and less than 200° C.

25. The production method of a hydroxyimide according to claim 17, wherein the compound of Formula (3) is γ-butyrolactone.

26. The production method of a hydroxyimide according to claim 17, wherein the heating temperature is 50° C. to 120° C.

* * * * *